United States Patent
Miñano et al.

(10) Patent No.: US 8,749,898 B2
(45) Date of Patent: Jun. 10, 2014

(54) STEPPED FLOW-LINE CONCENTRATORS AND COLLIMATORS

(75) Inventors: Juan Carlos Miñano, Madrid (ES); Pablo Benítez, Madrid (ES); Julio C. Chaves, Coimbra (PT); Maikel Hernandez, Madrid (ES)

(73) Assignee: Light Prescriptions Innovators, LLC, Altadena, CA (US)

( * ) Notice: Subject to any disclaimer, the term of this patent is extended or adjusted under 35 U.S.C. 154(b) by 932 days.

(21) Appl. No.: 12/860,273

(22) Filed: Aug. 20, 2010

(65) Prior Publication Data

US 2011/0203662 A1    Aug. 25, 2011

Related U.S. Application Data

(60) Provisional application No. 61/274,735, filed on Aug. 20, 2009.

(51) Int. Cl.
 *F24J 2/08*    (2006.01)
(52) U.S. Cl.
 CPC ........................... *F24J 2/085* (2013.01)
 USPC ........................... 359/729; 126/685
(58) Field of Classification Search
 USPC .......... 359/708, 726, 728, 729; 126/683, 685; 362/334, 335; 385/900
 See application file for complete search history.

(56) References Cited

U.S. PATENT DOCUMENTS

| 5,914,760 | A | 6/1999 | Daiku |
| 6,792,213 | B1 | 9/2004 | Okada et al. |
| 2009/0064993 | A1* | 3/2009 | Ghosh et al. .................. 126/685 |
| 2009/0067784 | A1 | 3/2009 | Ghosh et al. |

FOREIGN PATENT DOCUMENTS

| EP | 0 814 300 | 6/1997 |
| JP | H 10-012024 A | 1/1998 |
| JP | 2006-114239 A | 4/2006 |
| JP | 2007-033803 A | 2/2007 |
| WO | 2007-054848 | 5/2007 |
| WO | 2008-131561 | 11/2008 |
| WO | 2008-140106 | 11/2008 |
| WO | 2009-063416 | 5/2009 |

OTHER PUBLICATIONS

Supplementary European Search Report, Mar. 19, 2013, 10 pages.

* cited by examiner

*Primary Examiner* — Darryl J Collins
*Assistant Examiner* — Gary O'Neill
(74) *Attorney, Agent, or Firm* — Drinker Biddle Reath LLP

(57) ABSTRACT

One optical system comprises a first optical surface, a faceted second optical surface, and a faceted third optical surface. The optical system is operative to convert a first bundle of rays that is continuous in phase space outside the first optical surface into a second bundle of rays that is continuous in phase space outside the third optical surface. Between the second and third optical surfaces the rays making up the first and second bundles form discrete sub-bundles each passing from a facet of the second optical surface to a facet of the third optical surface. The sub-bundles do not form a continuous bundle in a phase space that has dimensions representing the position and angle at which rays cross a surface transverse to the bundle of rays.

14 Claims, 26 Drawing Sheets

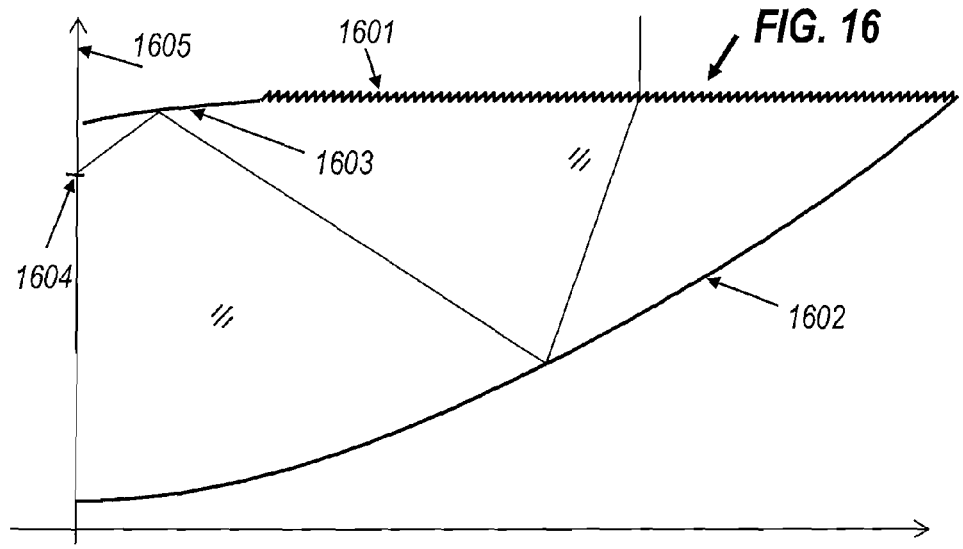
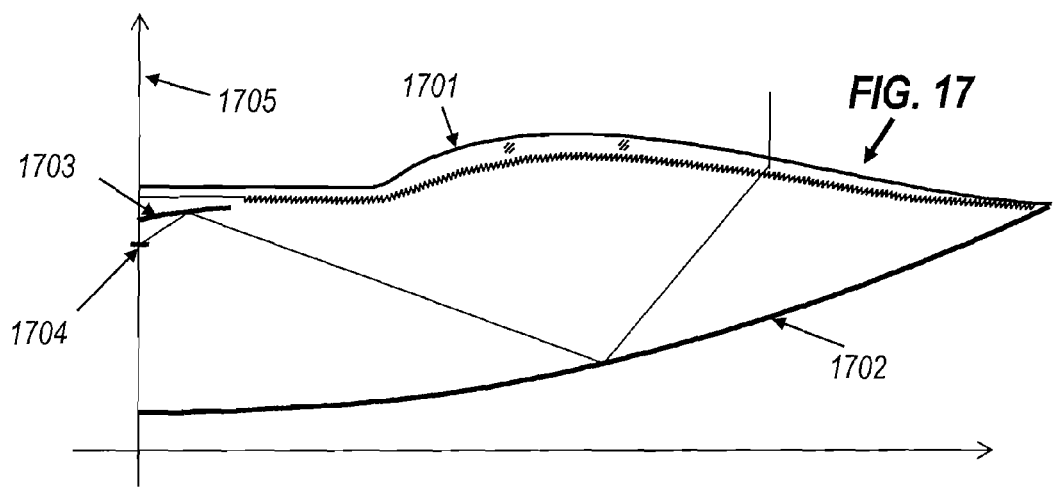

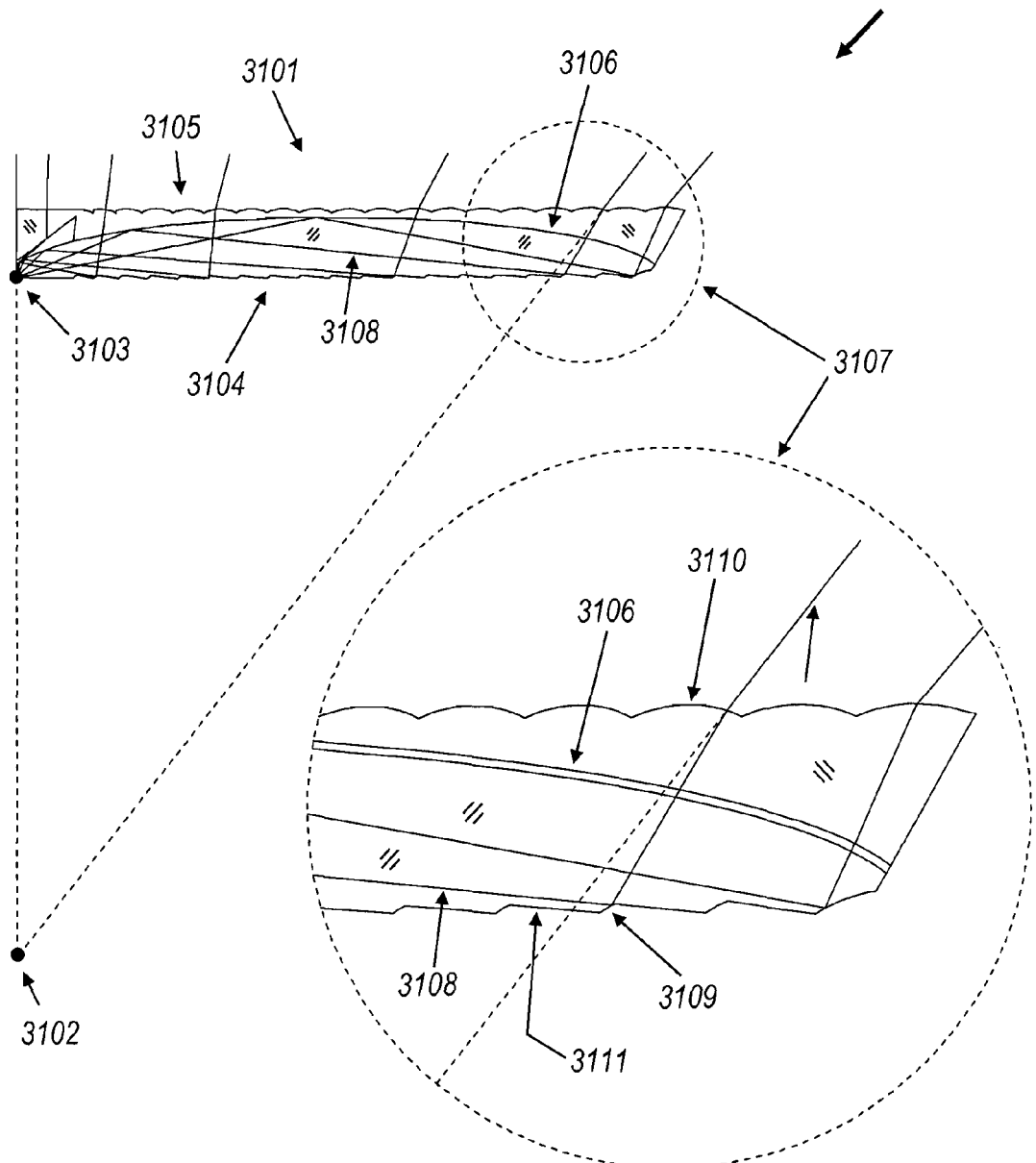

STEPPED FLOW-LINE CONCENTRATORS AND COLLIMATORS

CROSS REFERENCE TO RELATED APPLICATION

This application claims benefit of U.S. Provisional Patent Application No. 61/274,735, filed Aug. 20, 2009, which is incorporated herein by reference in its entirety.

BACKGROUND OF THE INVENTION

Stepped flow-line optics (SFL) were first developed at the turn of the century [Refs. 1-3] and rapidly found applications in the design of backlights [Refs. 4, 5], optics for combining light sources or efficiently distributing light to several locations [Refs. 6-10].

These optics are characterized by having a lower optic (light distributor) which collects the light from a source and distributes it over a given base surface. The bundle of rays coming from the source and redirected by the light distributor generates a field of flow-lines at the base surface. The design process then continues by following a flow-line, then moving across the flow-lines, then following another flow-line, then moving across them, and so on. Each portion of etendue contained between two consecutive flow lines that are followed by this stepped construction is then controlled by a separate (small) optic. This design method is then characterized by "breaking" the incoming light bundle at the base surface in small portions, each one controlled by a separate (small) optic. This process is such that it is possible to later recombine all these portions, rebuilding the continuity of the entire bundle seamlessly. Examples of optics in which this recombination process occurs and does not occur have been proposed [Ref. 3]. For example, this recombination process does not occur in the optics that combine the light from different light sources onto a single exit aperture. In general, the supporting surface may be flat or curved, open or closed (such as a cylinder) [Refs. 2, 3].

In certain of the configurations disclosed here, the seamless recombination of the bundle always occurs. One component of these devices is then the light distributor (lower optic) which distributes the light from the source on the base surface. The other component is made of many small optics constituting an upper optic (microstructure). Each one of these small optics is a microstructure element.

The optical surfaces of each microstructure element may be close together or far apart, creating different types of configurations. In the first case, the microstructure is very thin compared with the overall thickness of the optic. In the second case, the distance between the surfaces of each microstructure element is much larger than their size, one set of surfaces following the base surface and another set of surfaces following another surface, such as the entrance aperture.

It is the object of embodiments of optical devices proposed in the present specification to enable the design process to introduce many discontinuities in the light bundle, and then to eliminate those discontinuities further down the optic. By contrast, today's aspheric design methods only allow a single discontinuity to be introduced in the surfaces generated [Ref 11].

SUMMARY OF THE INVENTION

One aspect of the invention provides an optical system comprising, in order: a first optical surface; a faceted second optical surface; and a faceted third optical surface; wherein the optical system is operative to convert a first bundle of rays that is continuous in phase space outside the first optical surface into a second bundle of rays that is continuous in phase space outside the third optical surface; wherein between the second and third optical surfaces the rays making up the first and second bundles form discrete sub-bundles each passing from a facet element of the second optical surface to a facet element of the third optical surface, and the sub-bundles do not form a continuous bundle in phase space; wherein the phase space has dimensions representing the position and angle at which rays cross a surface transverse to the bundle of rays.

As will be seen from the more specific embodiments described below, many embodiments are substantially reversible. Most of the described embodiments act as concentrators in one direction and as collimators in the other direction. In many of these embodiments, when acting as a collimator the first optical surface acts as a distributing surface, supplying light to the second surface, which then forms a splitting facet structure or microstructure, and the third surface then forms a combining facet structure or microstructure. However, when the same optical system is used as concentrator, the functions of the splitting and combining structures are interchanged, and the "distributing surface" actually acts as a gathering surface. In general, therefore, terminology used in this specification that relates to light flowing in a specific direction is to be understood broadly as including the converse function for light flowing in the opposite direction.

Another aspect of the invention provides an optical system comprising, in order: a first optical surface and a faceted second optical surface; wherein the optical system is operative to convert a first bundle of rays that is continuous in phase space outside the first optical surface into a second bundle of rays that is continuous in phase space outside the second optical surface; wherein between the first and second optical surfaces the rays making up the first and second bundles form discrete sub-bundles passing from a facet of the second optical surface to the first optical surface, and the sub-bundles do not form a continuous bundle in phase space.

Another aspect of the invention provides an optical system comprising a faceted first optical surface and a second optical surface; wherein the optical system is operative to convert a first bundle of rays that is continuous in phase space outside the first optical surface into a second bundle of rays that is continuous in phase space outside the second optical surface; and wherein the faceted first optical surface is so configured that light entering the system from a defined light source fully flashes the exit aperture of the system.

Another aspect of the invention provides an optical system comprising a source or receiver, a faceted light-splitting optical surface, a distributing optical surface directing light between the source or receiver and a faceted light-splitting optical surface, and an exit aperture on the side of the light-splitting optical surface optically remote from the source or receiver, wherein light rays from the source or receiver directed by the distributing and light-splitting optical surfaces fully flash the exit aperture, and form at the exit aperture a ray bundle with edge rays from two wavefronts.

Embodiments of that aspect further comprise a faceted light-combining optical structure, wherein the faceted light-splitting and light-combining optical surfaces cooperate such that light forms discrete bundles between the faceted light-splitting and light-combining optical surfaces and forms continuous bundles outside those surfaces.

In certain embodiments, as shown by way of example in FIGS. 1, 13A, and 13B, the rays of said ray bundle at each point of the exit aperture form a triangle in two dimensions or a cone in three dimensions, having edge rays from said two distinct wavefronts.

In certain embodiments, especially in an embodiment where the optical system is a solar photovoltaic collector, and the receiver is a photovoltaic device, the cones of rays for all points of the exit aperture may have parallel axes and equal cone angles. The size of the cone angle is then chosen to accommodate the angular size of the sun (cone half angle approximately ¼ degree as seen from Earth) plus an appropriate tolerance for errors in aiming the concentrator at the sun. A similar optical configuration in a collimator can produce a narrow beam from a light source. In other embodiments, the cone angle and/or the direction of the cone axis may vary over the exit aperture to produce a different light emission or acceptance pattern.

In an embodiment, the criterion for sub-bundles that do not form a continuous bundle in phase space is that it is not possible to move from one such sub-bundle to another such sub-bundle by continuously varying the phase-space coordinates without passing through a region in phase-space that does not belong to any sub-bundle. The corresponding criterion for a continuous bundle in phase space is that it is possible to move throughout such a continuous bundle by continuously varying the phase-space coordinates without passing through a region in phase-space that does not belong to the bundle. It is desirable, but not essential and in many practical embodiments not achievable, for the phase space representation of the recombined bundle to be free from holes.

BRIEF DESCRIPTION OF THE DRAWINGS

The above and other aspects, features and advantages of the present invention will be apparent from the following more particular description thereof, presented in conjunction with the following drawings wherein:

FIGS. 14-21 show variations of the assembly of FIG. 13C.

FIG. 22 shows a mirror generating a given light distribution on a given line for the case of a point source.

FIG. 23 is a diagram similar to FIG. 22 for a case of an extended source.

FIG. 31A shows an axial cross section through an optic according to the design method of FIG. 30.

DETAILED DESCRIPTION OF THE PREFERRED EMBODIMENTS

A better understanding of various features and advantages of the present invention will be obtained by reference to the following detailed description of the invention and accompanying drawings, which set forth illustrative embodiments in which certain principles of the invention are utilized.

Figure 1:
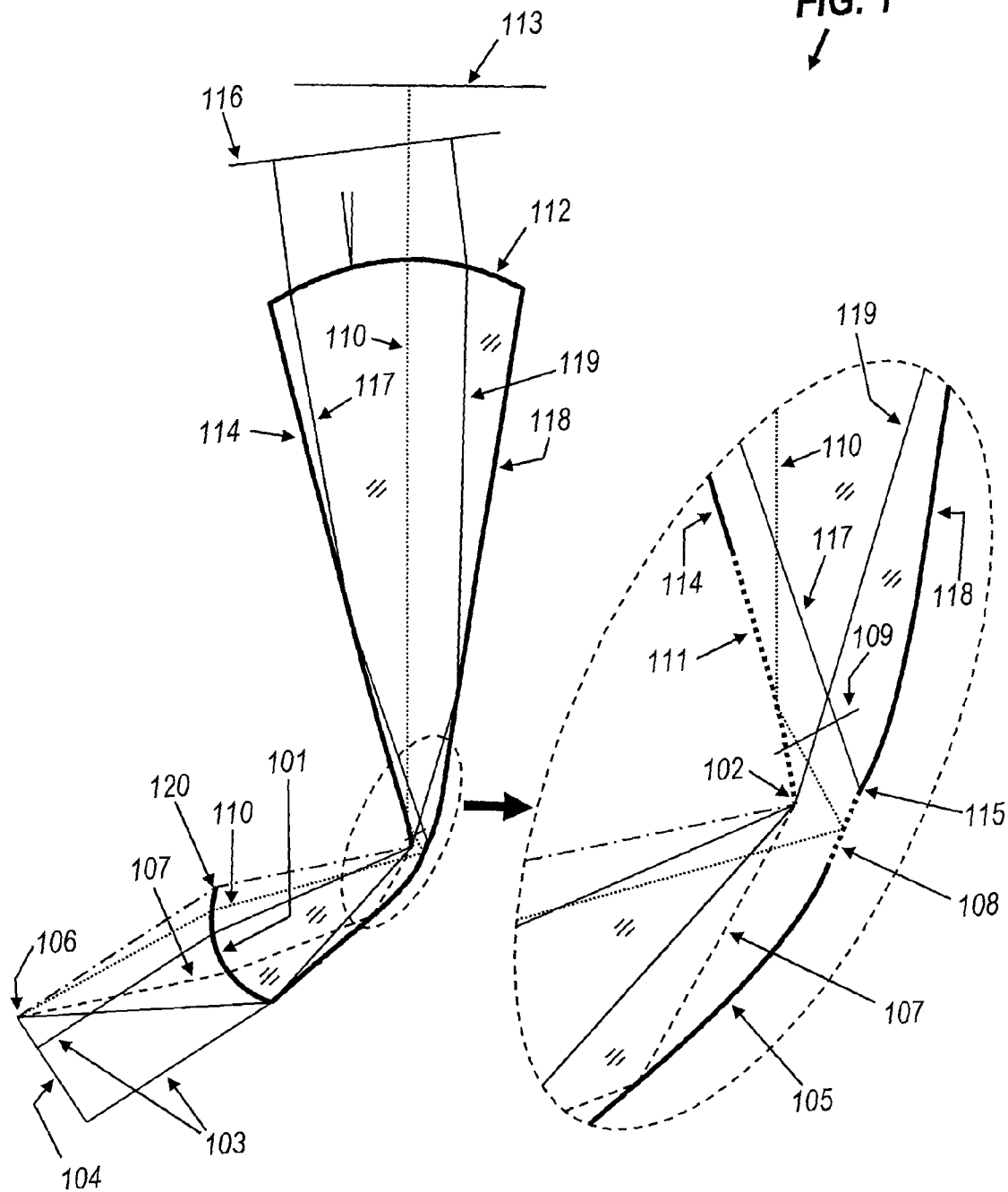
FIG. 1 shows an upper optic for a stepped flow-line concentrator.

FIG. 1 shows the geometrical definition of an upper optic of a first embodiment. The insert on the right shows a detail of the mid section of the optic and the paths of some light rays. Cartesian oval 101 concentrates to point 102 the parallel rays 103 perpendicular to flat wavefront 104. Wall 105, starting at one edge of Cartesian oval 101, concentrates to point 102 a first portion of light rays emitted from point 106, at one edge of bundle of parallel rays 103, and propagated through Cartesian oval 101, as shown by exemplary ray 107. Wall 108, continuing on from wall 105, reflects a second portion of light rays emitted from point 106 and propagated through 101, so that those rays proceed in a direction perpendicular to flat wavefront 109. This is the case, for example, of ray 110. These rays then reflect on wall 111 towards the top surface 112 where ray 110 is refracted in a direction perpendicular to flat wavefront 113. Wall 114, continuing from wall 111, concentrates light rays perpendicular to flat wavefront 116, after refraction at the top surface 112, to point 115 (propagating in the opposite direction from the rays previously discussed). This is the case, for example, of ray 117. Wall 118, continuing from point 115, reflects to point 102 a further portion of the light rays perpendicular to wavefront 116. This is the case of exemplary ray 119. Between point 120, at the end of Cartesian oval 101 further from wall 105, and point 102 there is no optical wall, so that section of wall may be defined using some other criteria (as long as this wall is above the straight line connecting points 120 and 102).

Figure 2:
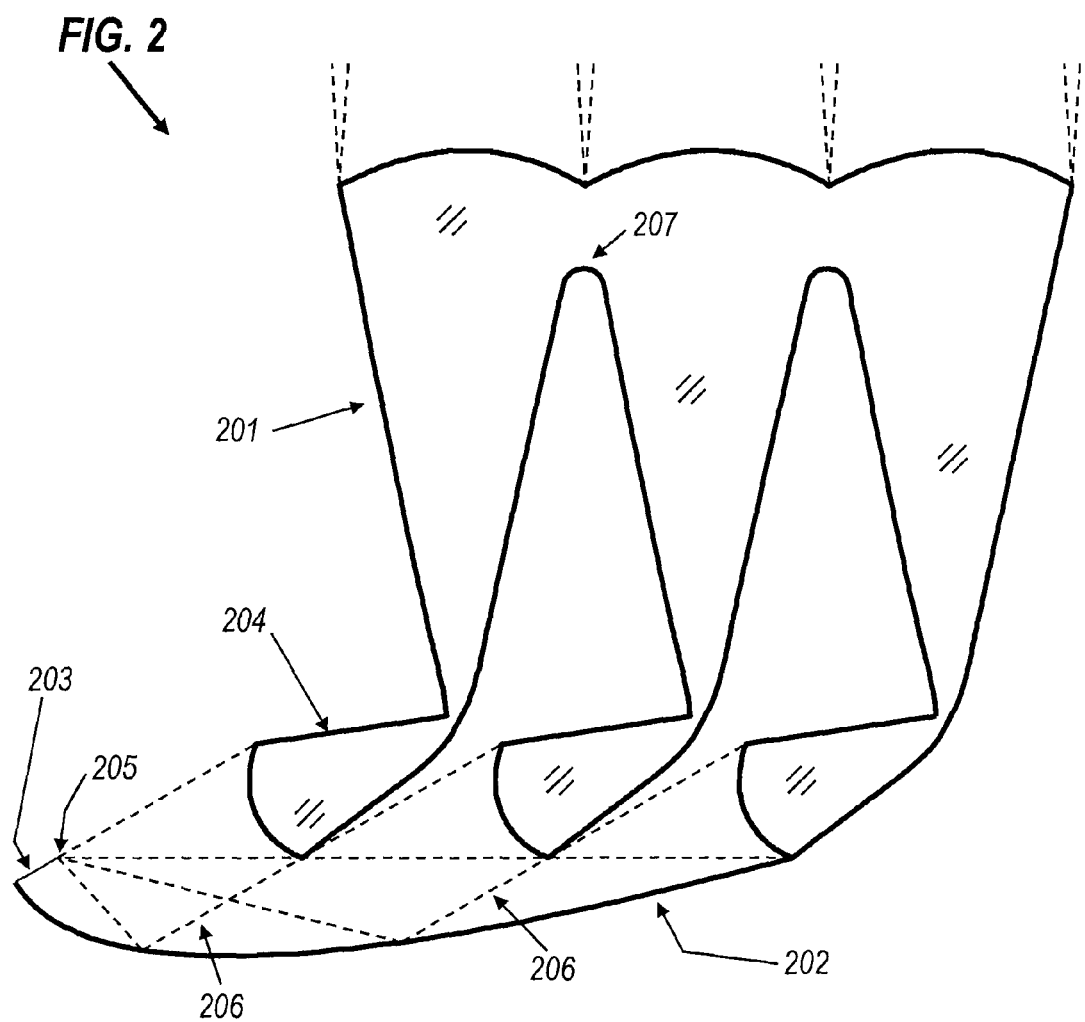
FIG. 2 shows a stepped flow-line concentrator (or collimator) resulting from combining several upper optics with one lower optic.

FIG. 2 shows a combination of optics like the one in FIG. 1 into a stepped flow-line concentrator. The top portion of the side surfaces 114 and 118, closest to top surface 112, has little optical effect, so part of them was removed so that several of these optics can be combined into a single piece. This resulting single piece is upper optic 201. It is combined with lower optic 202, which is a parabolic mirror. The receiver is at flat surface 203, extending from the pole to the focus of the parabolic mirror. Surfaces 204 on the upper optic, corresponding to the section between points 102 and 120 in FIG. 1, are non-optical. Parabolic mirror 202 has focus 205 and axis parallel to parallel rays 206, corresponding to rays 103 in FIG. 1. The optics are aligned so that ray 103 or 206 from the upper end 120 of Cartesian oval 101 of one optic just passes the lower end of Cartesian oval 101 of the next optic. Cartesian ovals 101 of FIG. 1 are combined in FIG. 2 to form a discontinuous faceted surface. Top surfaces 112 of FIG. 1 are combined in FIG. 2 to form a faceted surface. A larger number of optics can be combined in the upper optic. In that case, the lower optic and receiver must be scaled accordingly (their shape does not change, only their size changes).

Figure 3:
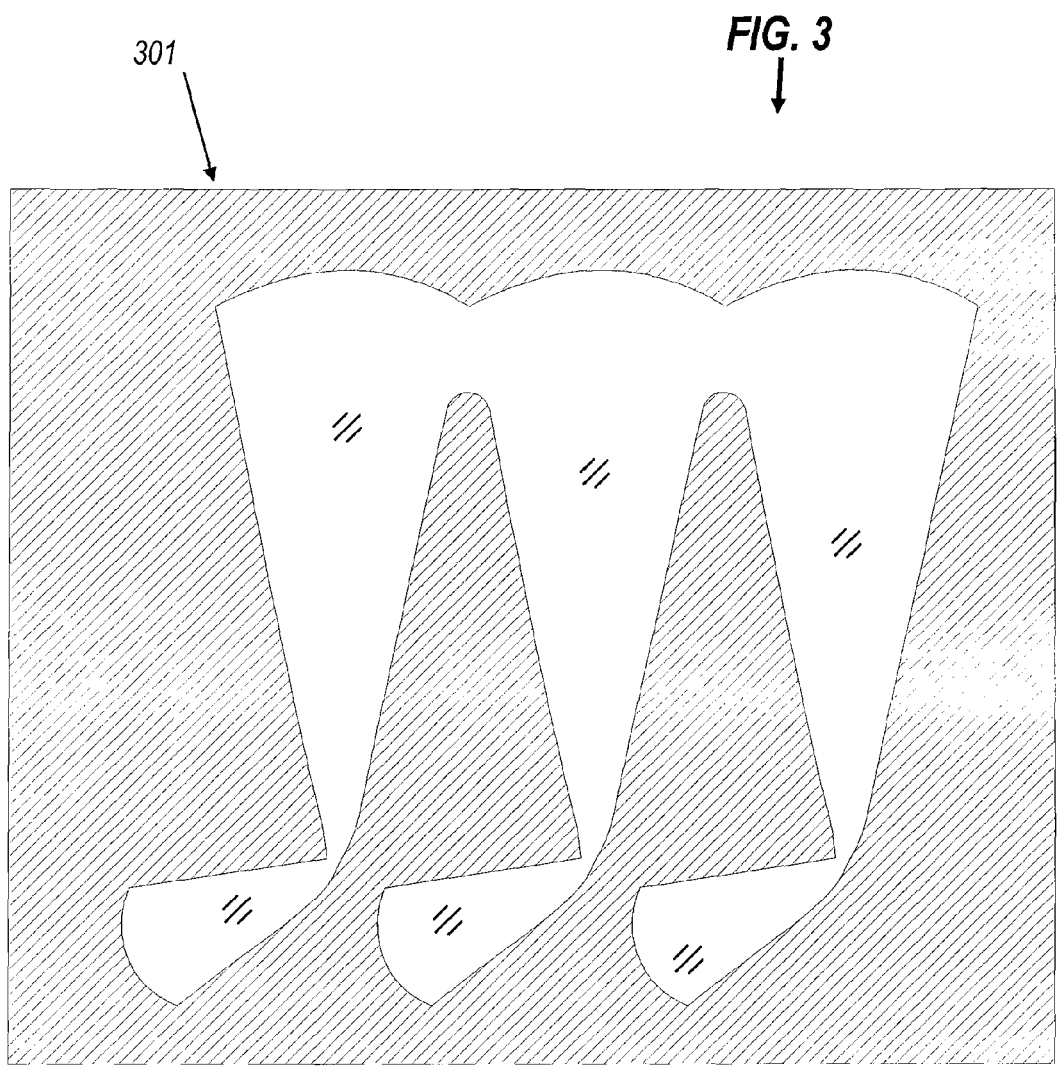
FIG. 3 shows the mold for extruding the upper optics of the concentrator in FIG. 2.

FIG. 3 shows an example of a mold 301 for extruding the upper optic 201 of FIG. 2. The upper optic 201 is then uniform and of indefinite length perpendicular to the plane of FIG. 2. The light rays shown in FIG. 1 may then be projections onto the plane of FIG. 1 of rays that are oblique to that plane. The number of linked cavities in the mold of FIG. 3 may be varied in order to vary the number of linked optics in the upper optic 201 of FIG. 2.

Figure 4:
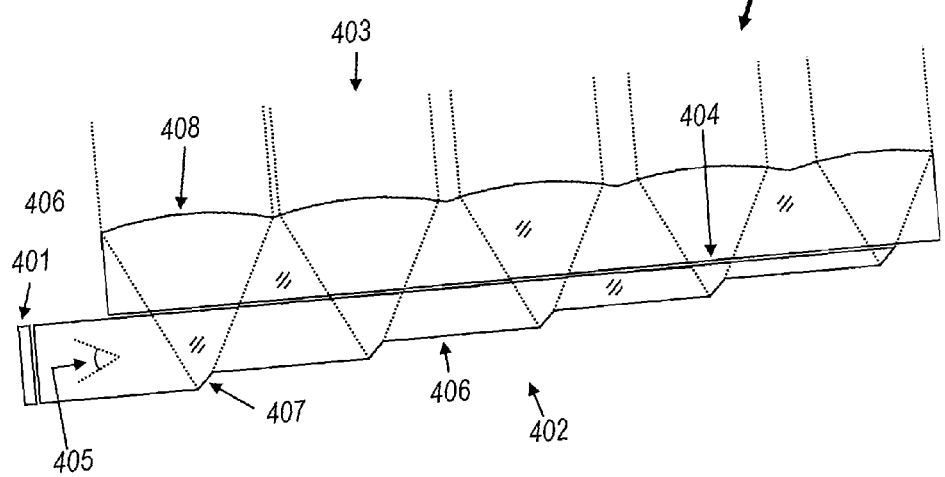
FIG. 4 shows a stepped flow-line concentrator (or collimator) composed of two optics united by a layer of low refractive index material.

FIG. 4 shows a collimator for a source 401. The collimator is composed of two parts: a lower optic 402 and an upper optic 403, separated by a layer of low refraction index material 404 (which may be air). The lower optic is a piece of solid, transparent material (dielectric) bounded by the low refractive index material 404 at the top and by a stepped flow-line at the bottom. This stepped flow-line is composed of lines 406 that follow the flow lines and ejectors 407 that cross the flow lines. Light enters the lower optic confined to an angular aperture 405 and travels inside it confined by total internal reflection (TIR) between the bottom surface lines 406 and the low refraction index layer 404. As it travels, this light encounters mirrors 407, which cross the flow lines, and reflect light upwards towards the upper optic. This reflected light can cross the low refraction index layer 404 because the angle of incidence it forms with the low refraction index layer 404 is not enough for TIR. This reflected light is then collimated by lenses 408, exiting the optic with collimation in the vertical direction. Mirrors 407 and lenses 408 may also be designed simultaneously using, for example, the SMS design method. In general the mirrors 407 will be curved.

When designing with the SMS method for 2 surfaces, two input and two output bundles of rays have to be prescribed. The SMS method provides the profile of the two optical surfaces that couple the input bundles to the output bundles. In this case, the two surfaces to design are the lenses 408 and the mirrors 407. The two input bundles can be selected as the two edge ray bundles coming from the source, i.e., the two bundles travelling inside the lower optic 402 with the maximum angles with respect to the flow lines 404, 406. The two output bundles are the two edge ray bundles defining the collimation after refraction at the lenses 408. In general, lenses 408 are different from each other, and mirrors 407 are different from each other.

The SMS is not the only possible design method. Another possibility is, for instance, to design lenses 408 to form a good image of the edges of mirrors 407, and to design the mirrors 407 to cast the light inside their corresponding lenses. This design is of interest for those applications needing a sharp cut-off of the illumination pattern, such as automotive applications.

As in all other cases, FIG. 4 can also be used as a light concentrator, in particular for photovoltaic applications, replacing the source 401 by a solar cell and facing the vertical direction towards the sun.

Figure 5:
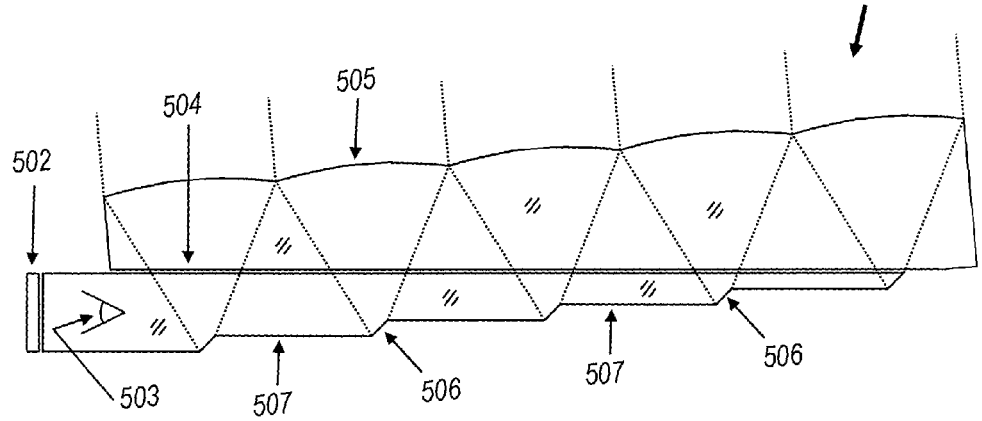
FIG. 5 shows a similar optic to the one in FIG. 4, but now with a constant thickness for the whole optic.

FIG. 5 shows a similar optic to the one in FIG. 4, but in which all mirrors 506 of the lower optic are now at the same level, with the flow line surfaces sloping down from the top edge of each mirror 506 to the bottom of the next mirror. Lenses 505 are all also at the same level, and therefore at the same distance from their respective mirrors 506. The lenses 505 all have the same focal distance. This allows the use of the same lens and the same mirror design for the whole array. The upper and lower optics are separated by low refraction index layer 504, which is parallel to the flow lines of collimated light and sloping relative to the levels of lenses 505 and mirrors 506. Light comes from a source 502, enters the optic confined to an angular aperture 503 and leaves the optic collimated around the vertical direction.

In this and similar embodiments, the reflective surface formed by low refraction index layer 504 and the discontinuous reflective surface 507 together form a first optical surface (distributor surface if 502 is a source, collector surface if 502 is a receiver). Facets 506 form a discontinuous, faceted second optical surface, and facets 505 together form a faceted third optical surface with a discontinuous first derivative (cusped or kinked).

Figure 5A:
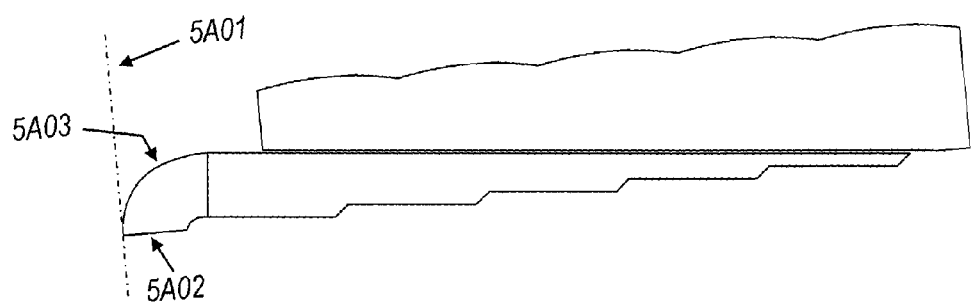
FIG. 5A shows an optic such as the one in FIG. 5 but with a horizontal receiver.

FIG. 5A shows the same optic as FIG. 5, but now also shown is a revolution axis 5A01. Revolving the optic around this axis results in a device with circular symmetry. "Black hole" optic 5A03 collects the light coming in radially from all sides and concentrates it onto receiver 5A02.

Figure 5B:
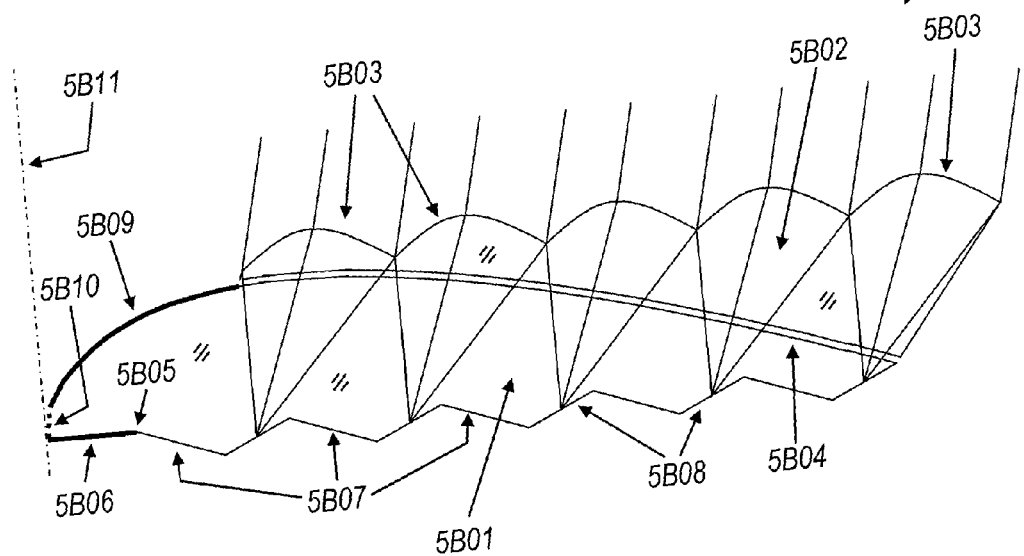
FIG. 5B shows a variation in the configuration of the FIG. 5 optic.

FIG. 5B (not to scale) shows an optic similar to the one in FIG. 5, but with curved elements in the lower optic 5B01. Now there is no air gap between source 5B06 and the optic. Upper optic 5B02 is covered by an array of lenses 5B03. These two optics are separated by a layer of low refractive index material 5B04 shaped as a parabola with focus 5B05 at the edge of the source 5B06 and axis parallel to the flat flow-lines 5B07. As it travels inside the lower optic, light is confined (by TIR) between layer 5B04 and flow lines 5B07 and extracted by steps 5B08 (crossing the flow lines) towards the lenses 5B03 on the upper optic, which lenses collimate this light as it exits the device. Portion 5B09 of the top surface of the lower optic is part of the same parabola as 5B04 and needs to be mirrored since TIR will not occur at this surface close to the source 5B06. The lower optic is completed with circular arc 5B10 centered at edge 5B05 of the source 5B06. This geometry with a parabolic separation between upper and lower optics minimizes the number of reflections inside the lower optic (and has flat flow lines 5B07). This has practical implications, since reflections always produce some scattering of the light. Minimizing the number of reflections therefore increases the efficiency of the system. Each one of the steps 5B08 and corresponding lens 5B03 can be designed using the SMS method.

Typical concentrators are designed by imposing constant optical path length between the input wavefronts of the edge rays and the edges of the receiver. That is the case, for example, of the (unstepped) RXI concentrator. Stepped flow-line optics (SFL), however, do not fulfill this condition. The result is that light entering at points further away from the receiver will travel a longer optical path length (and distance) than the corresponding light inside an RXI. Also, light entering at points closer to the receiver will travel a shorter distance inside the SFL concentrator than the corresponding distance inside an RXI. In two-dimensional geometry this is not an issue and both the RXI and the SFL are ideal concentrators.

Let us now consider the case in which these optics are given circular symmetry. Consider also a pinhole on the entrance aperture of each one of these concentrators. In the case of the RXI, two rays contained on the sagittal plane through the pinhole will travel inside the optic and end up (approximately) at the edges of the receiver. That is true, independent of the radial distance of the pinhole. In the case of the SFL optic, however, light entering a pinhole further away from the center will travel a longer distance than it would in the comparator unstepped RXI and, therefore, illuminate a spot with a larger radius, increasing the size of the receiver and reducing concentration. On the other hand, light entering a pinhole closer to the center will travel a shorter distance than it would in the RXI and, therefore, illuminate a spot with a smaller radius, generating a hotspot in the center. The result is that the SFL optic with circular symmetry needs a larger receiver and will illuminate it non-uniformly, creating a hotspot in the center. Note that the concentration at the center of the SFL receiver cannot be higher than the comparator RXI generates, since the RXI is assumed to be fully optimized and (almost) reaches the maximum limit of concentration.

An SFL concentrator with circular symmetry can be obtained, for example, by giving the optic in FIG. 5B circular symmetry around axis 5B11. Choosing a revolution axis further to the left (away from the optic) will result in a concentrator with a receiver shaped as a hollow (annular) disk, or a collimator with a source shaped as a hollow disk.

Figure 6:
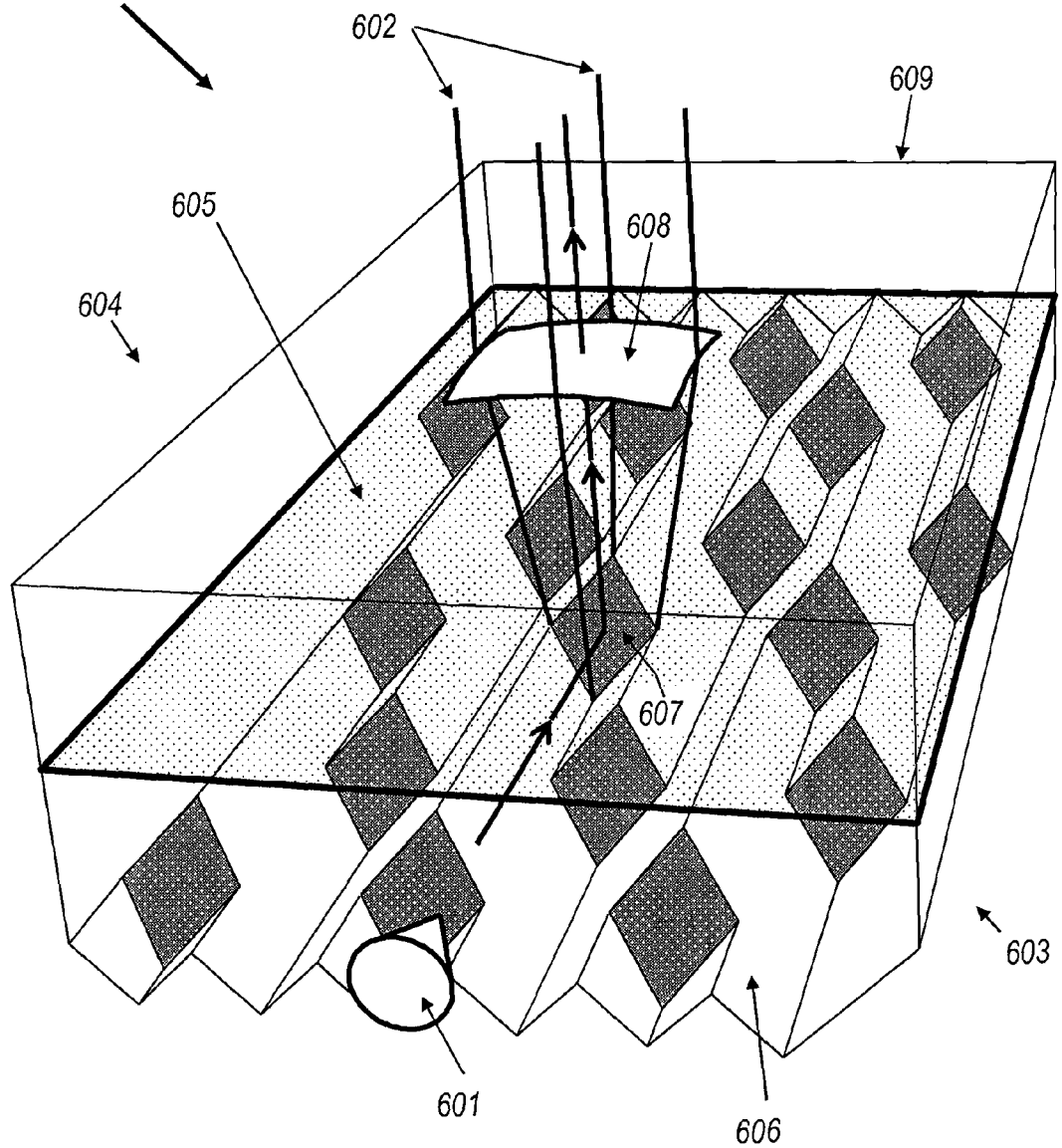
FIG. 6 shows a 3D view of an optic with V shaped surfaces along the flow lines of the lower optic, extraction steps and corresponding "lenses" on the upper optic that collimate the reflected light at the steps.

FIG. 6 shows a collimator that accepts light confined to cone 601 and emits collimated light 602. The collimator is composed of two dielectric parts, the lower optic 603 and the upper optic 604, separated by a low refraction index material 605 (which may be air). Light inside part 603 is confined by stepped flow-surface 606 at the bottom and the low refraction index layer at the top, which together form a first or distributor surface. As light travels inside lower optic 603, it encounters tilted mirrors 607 (which cross the flow lines) and is reflected upwards. Mirrors 607 together form a discontinuous, faceted second optical surface. The flow-surfaces that arrive at the bottom edges of mirrors 607, continue backwards from the top edges of mirrors 607. Light reflected by these mirrors in the lower optic is collected and collimated by lenses 608 on the upper optic. In FIG. 6, only one of these lenses is shown so that the interior of the collimator can also be seen. In a real optic, however, there is one of these lenses 608 for each mirror 607. An array of lenses 608 completely covers the top surface 609 of the upper optic and forms a faceted third optical surface. Lenses 608 and mirrors 607 may be free-form, designed using, for example, the SMS-3D design method.

Figure 7:
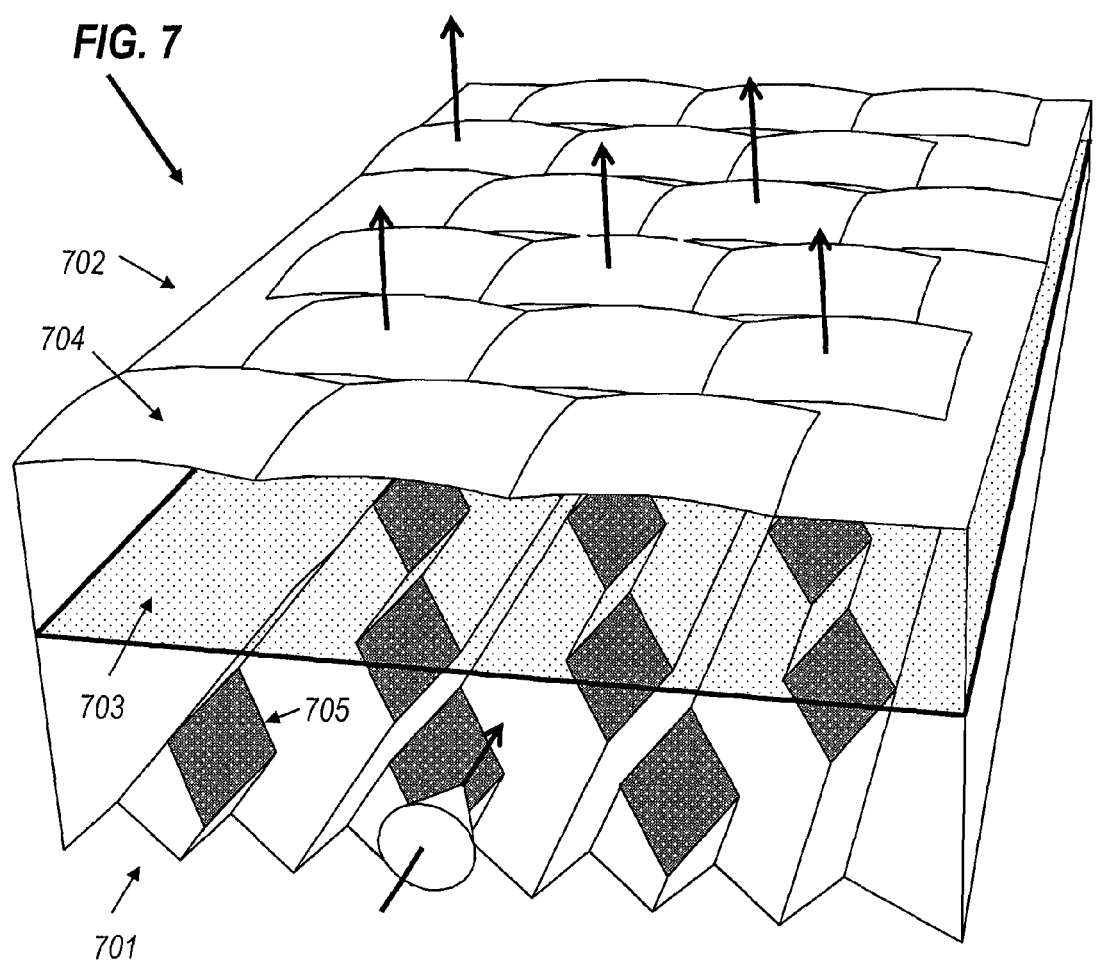
FIG. 7 shows the optic of FIG. 6 with the upper optic fully covered with "lenses", one for each step on the lower optic.

FIG. 7 shows a lower optic 701 and an upper optic 702 separated by a low refraction index layer 703. The upper optic is covered with lenses 704, one for each mirror 705 in the lower optic.

Figure 8:
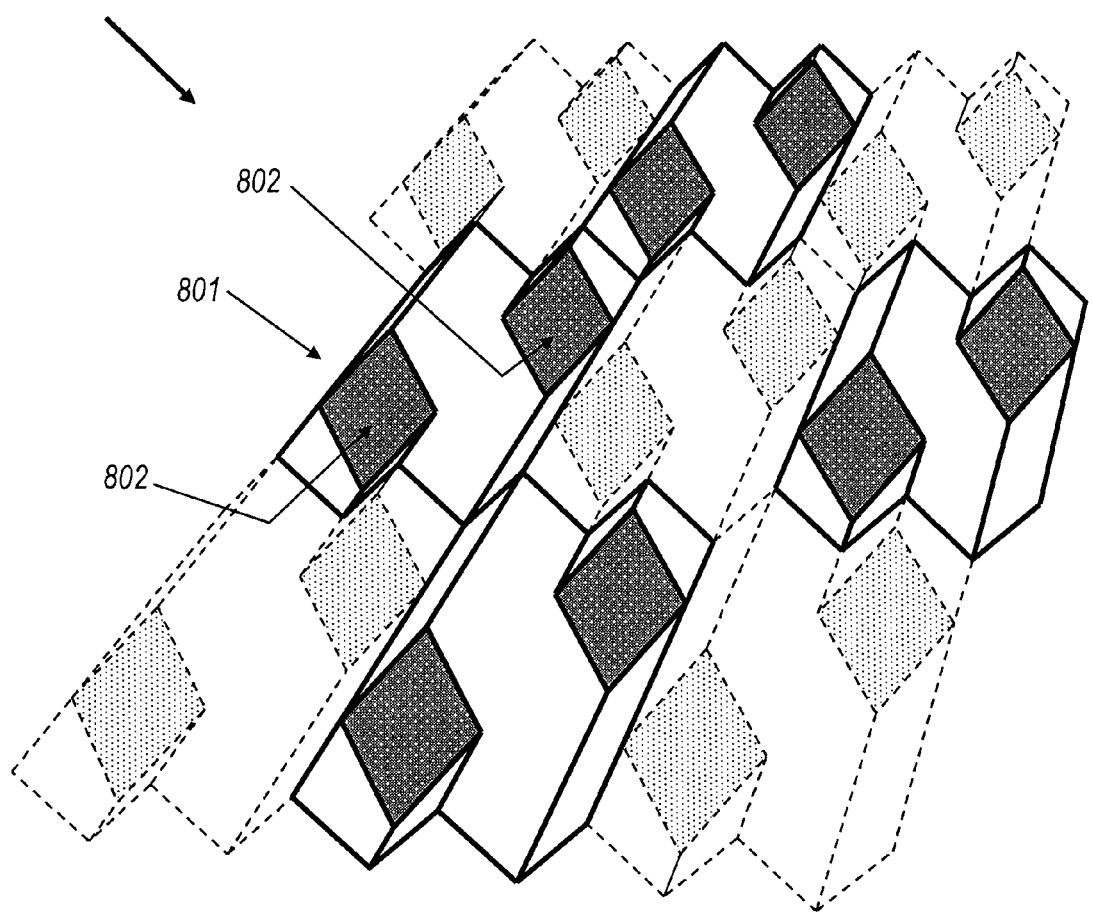
FIG. 8 shows an array of elements, forming the complete lower optic.

FIG. 8 shows a detail of a lower optic light guide similar to the lower optics of FIGS. 6 and 7. The lower optic of FIG. 8 results from tiling several parts, such as 801 side by side. Of course, a commercial embodiment of the lower optic may be made in a single piece or in larger tiles, depending on its size. However, recognizing that the upper and lower optics are each formed from a repeating pattern of smaller elements is still useful. The result is a stepped flow-surface in which each step results from introducing mirrors 802 that cross the flow lines of the radiation traveling inside the guide.

Figure 9:
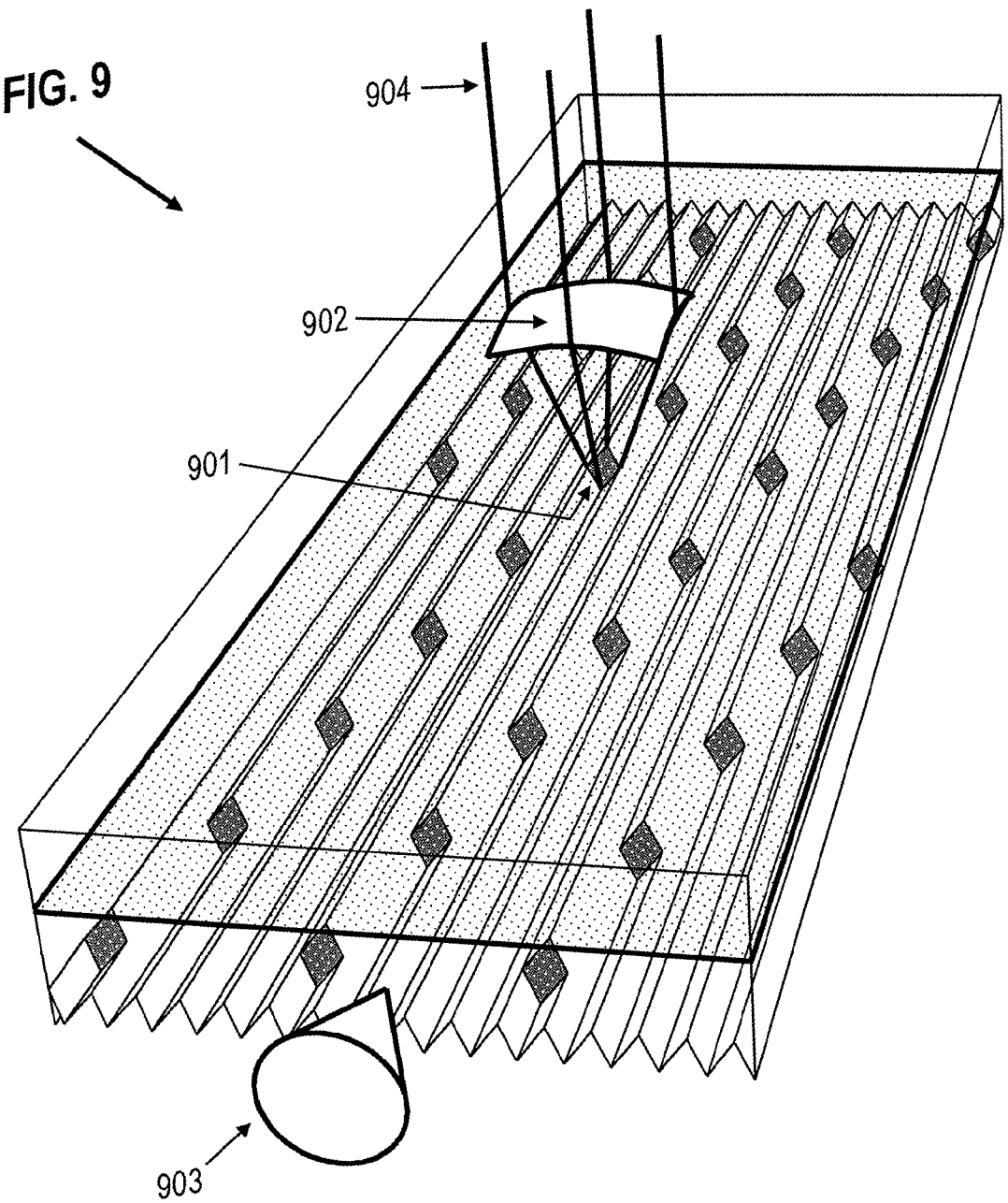
FIG. 9 shows an optic similar to the one in FIG. 6, but for a tighter collimation.

FIG. 9 shows an optic similar to that in FIG. 6, but now with the tilted mirrors 901 much smaller relative to their spacing on the bottom surface of the lower optic. This results in lenses 902 that are much larger than the tilted mirrors and, therefore, in an optic that emits light 904 much more collimated than the incoming light 903, or a concentrator with a high concentration factor. The mirrors 901 collectively still form a discontinuous faceted surface, even though the discontinuities are now large compared with the facets.

Figure 10:
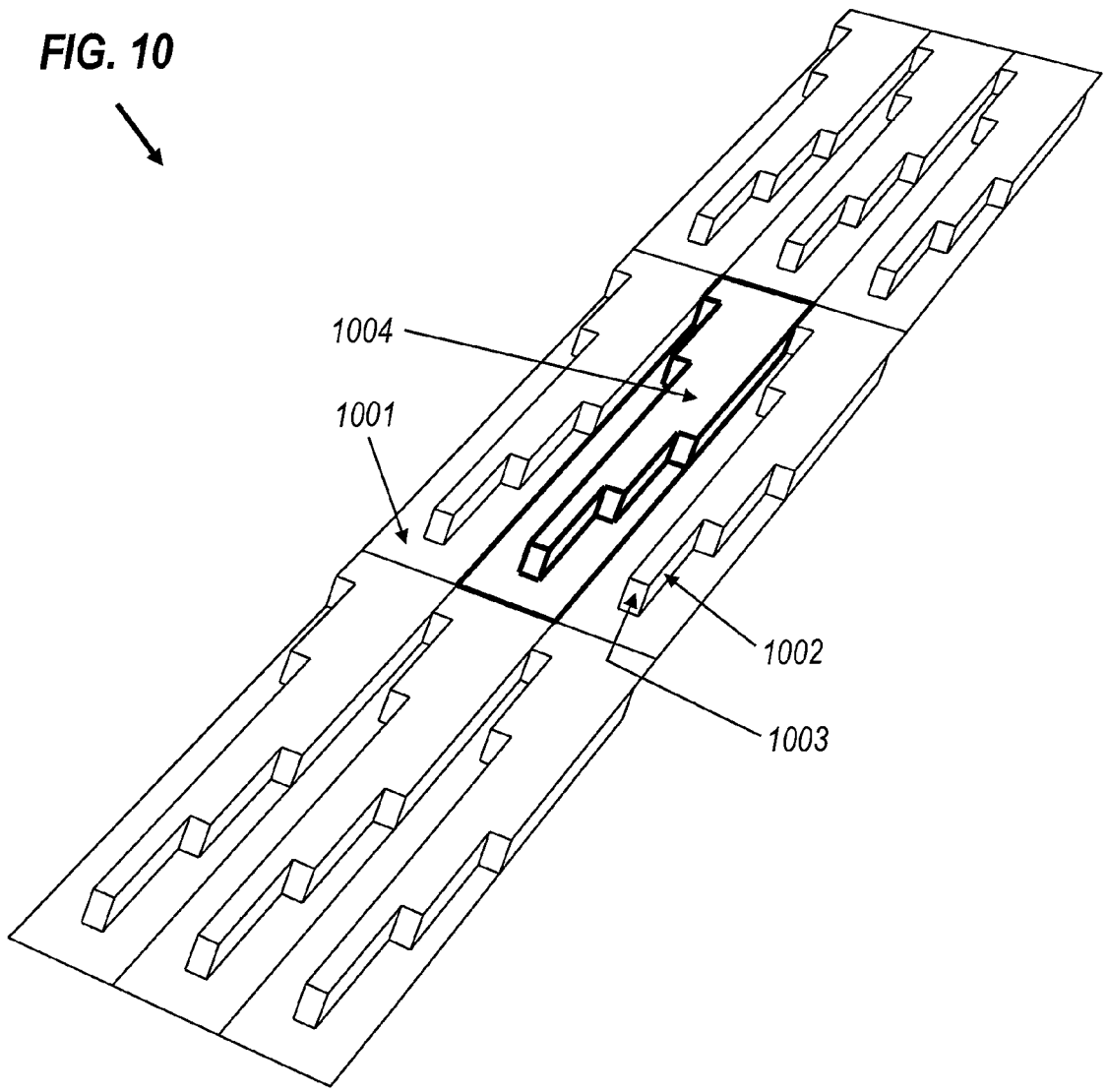
FIG. 10 shows another possible design for the lower optic, with surfaces following the flow lines and steps crossing them and extracting the light. The complete lower optic is composed of an array of similar elements.

FIG. 10 shows another possible geometry for the stepped flow-surface forming the bottom of the lower optic. Now light is confined by horizontal walls 1001 and vertical walls 1002 and extracted by mirrors 1003. The bottom surface of the lower optic is in this case obtained by a rectangular tiling of several pieces 1004.

Figure 11:
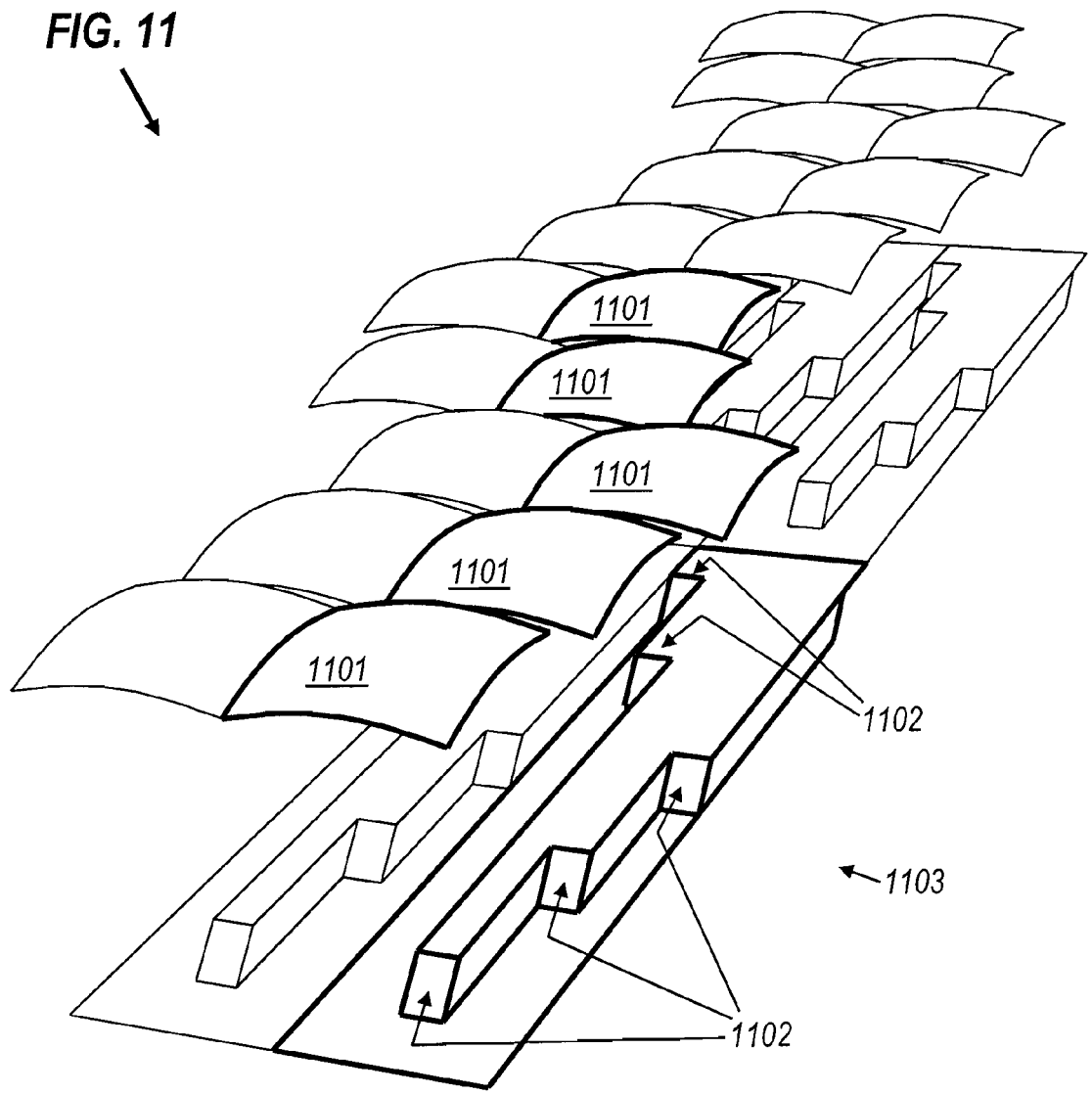
FIG. 11 shows part of the lower optic of FIG. 10 with the corresponding "lenses" covering the upper optic.

FIG. 11 shows a tiling similar to that in FIG. 10, but with the corresponding lenses 1101 on top of the extraction mirrors 1102. Pieces 1103 with extraction mirrors 1102 and corresponding lenses 1101 are tiled side by side.

Figure 12:
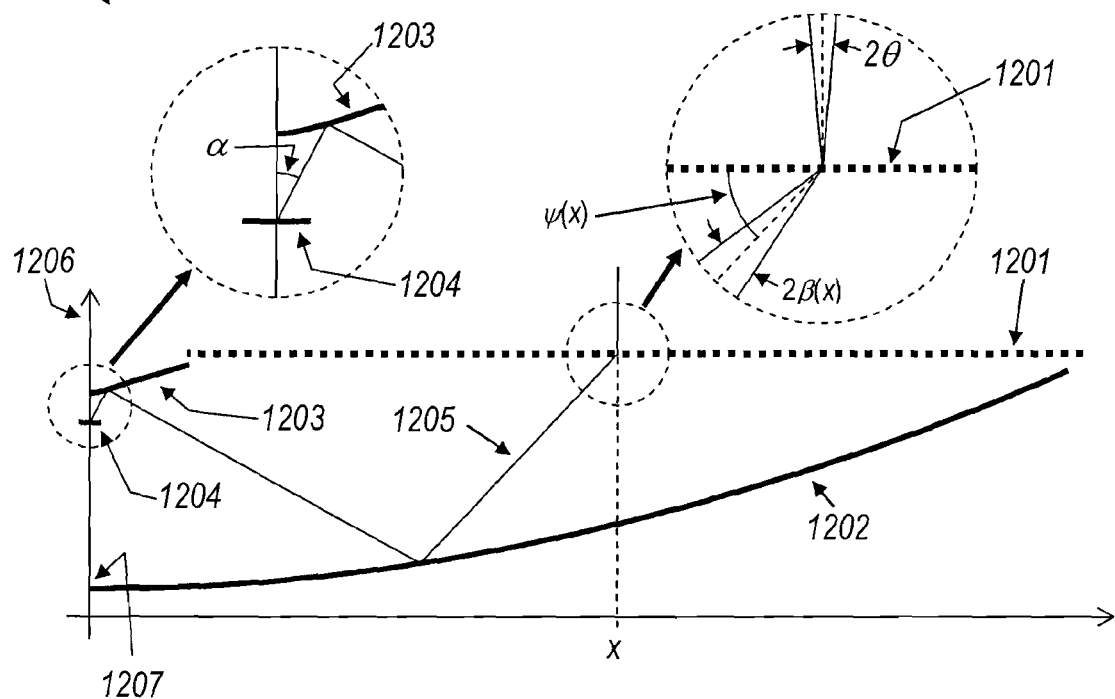
FIG. 12 shows a diagrammatic view of a compact concentrator.

FIG. 12 shows an embodiment for a compact concentrator. It is composed of an upper optic 1201 and a two surface lower optic. In this example the lower optic is composed of two mirrors 1202 and 1203. We denote each reflection by an X and call this lower optic an XX. The optic has a receiver 1204.

A vertical ray 1205 is deflected by the upper optic 1201 towards the first mirror 1202 of the lower optic and from there towards the second mirror 1203 of the lower optic and finally towards the receiver 1204. Although in this example the receiver 1204 is shown well above the lower tip 1207 of mirror 1202, they can be much closer together and receiver 1204 may even be below tip 1207 of mirror 1202. Also, mirror 1202 may be truncated close to the optical axis 1206 (since it is shaded by mirror 1203), exposing receiver 1204 to the outside environment (for electrical connection, cooling, and mechanical support) even if receiver 1204 is above mirror 1202.

In the limiting case in which the acceptance angle of the optic goes to zero (aplanatic limit), the path of the rays fulfills $x=m \sin(\alpha)$ where m is a constant, x is the horizontal coordinate at which the ray enters the optic and $\alpha$ is the angle with which the ray hits the receiver 1204. This condition guarantees that, in this limit case, the meridional acceptance of the concentrator equals its sagittal acceptance when the optic has circular symmetry about vertical axis 1206 through receiver 1204 and tip 1207, which is then the pole of the circular mirror 1202 (although the optic may also have linear symmetry). In that case, the mirrors 1203, 1202 in the lower optic are designed so that, if traced backwards (as if light were being emitted from the receiver 1204), the light rays would hit the upper optic 1201 at an angle given by a function $\psi(x)$. This function is a parameter of the design. For different functions $\psi(x)$, different upper and lower optics result.

The upper optic may in this case be designed as a Fresnel lens closer to the optical axis 1206 and as a TIR lens further away, just like in the case of a regular TIR lens.

In the case of a finite acceptance angle the incoming light has an angular aperture $2\theta$ and it exits the upper optic with an angular aperture $\beta(x)$ that fulfills $\theta = \arcsin(\sin \psi(x) \sin \beta(x))$ [See Ref. 3]. In that case, the optical surfaces in the upper optic are designed with the SMS design method [See Ref 3]. The two optical surfaces (two mirrors in this example) of the lower optic are also designed with the SMS design method.

This configuration thus makes it possible to shape the lower optic mirrors 1202, 1203 so that each point of the faceted lens 1201 has the same acceptance angle $2\theta$ (for a concentrator) or emission beam angle (for a collimator) for rays to and from the receiver or source 1204 without needing an explicit second faceted surface. Alternatively, as explained below with reference to FIGS. 13A to 13C, two distinct faceted surfaces can be integrated into a single faceted optical element. The edge rays of the acceptance cone of angle 2θ in FIG. 12 correspond to the rays of two extreme wavefronts, as shown at 113 and 116 in FIG. 1.

Figure 13A:
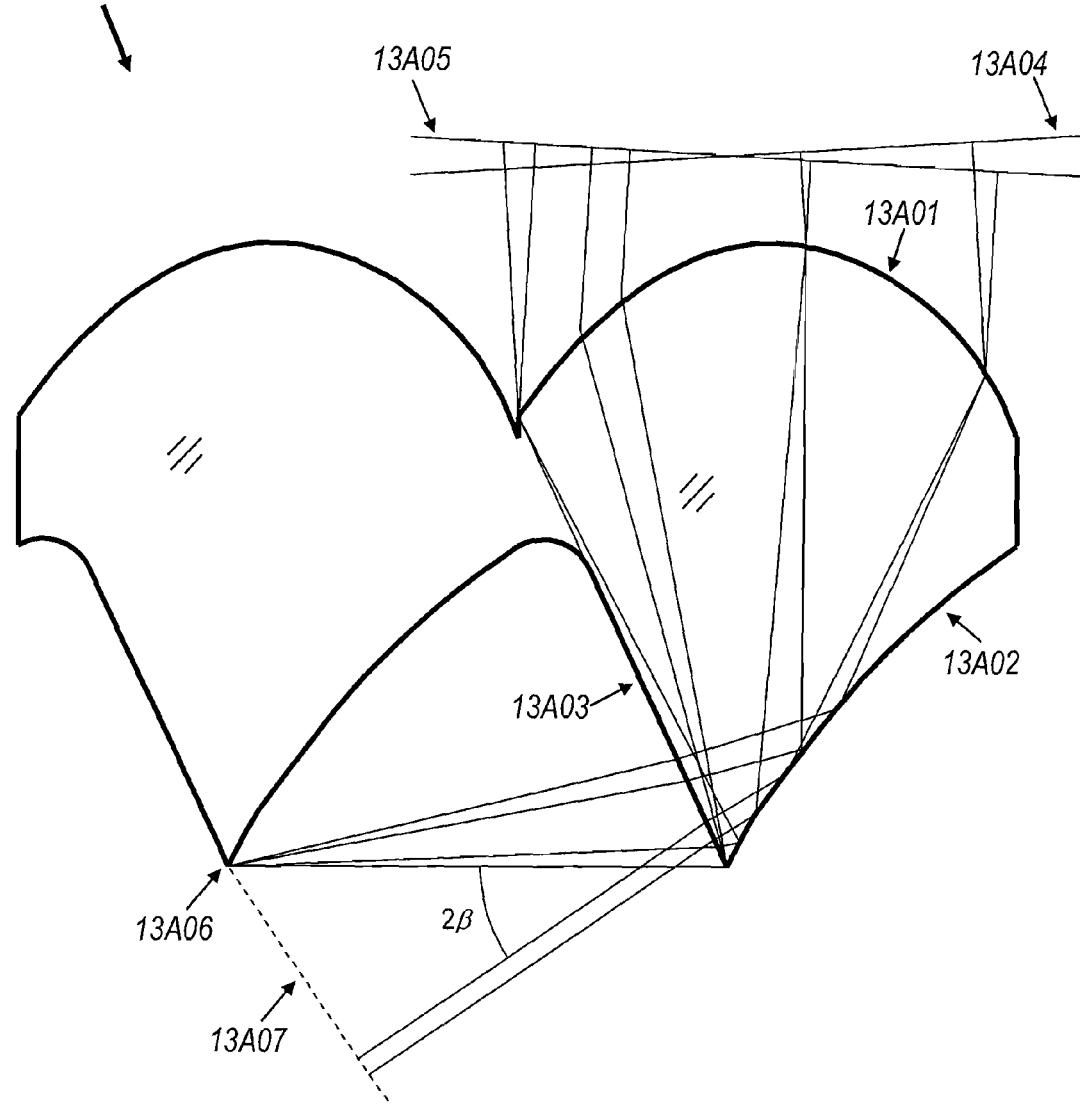
FIG. 13A is a close-up view of a pair of upper optic elements.

FIG. 13A shows two elements of an upper optic, each one composed of a top refractive surface 13A01, a reflective surface 13A02 and another refractive surface 13A03. It is, therefore an RXR optic (where R stands for refraction and X for reflection). This example shows the particular case of the upper optic in FIG. 12 in which $\beta=\psi$, although the SMS design method can be used the same way in designs for other parameter values of these angles. As may be seen from the rays shown in FIG. 13A, the refractive surfaces 13A01 of all the elements together form a faceted optical surface with a discontinuous first derivative (cusped or kinked) and the reflective surfaces 13A02 of all the elements together form a faceted optical surface with a discontinuous surface.

In this particular example, the edge rays perpendicular to wavefront 13A04 are concentrated onto point 13A06 at the lower tip of the next optic to the left of the one under consideration, while the edge rays perpendicular to wavefront 13A05 exit the optic in a direction perpendicular to wavefront 13A07.

Also in this example, second refractive surface 13A03 was prescribed and surfaces 13A02 and 13A01 calculated using the SMS design method. Other options include prescribing the shape of 13A01 and calculating 13A02 and 13A03 or prescribing surface 13A02 and calculating surfaces 13A01 and 13A03. An option with special practical interest is when top surface 13A01 is chosen as flat and horizontal since this results in an upper optic with a flat top surface.

Figure 13B:
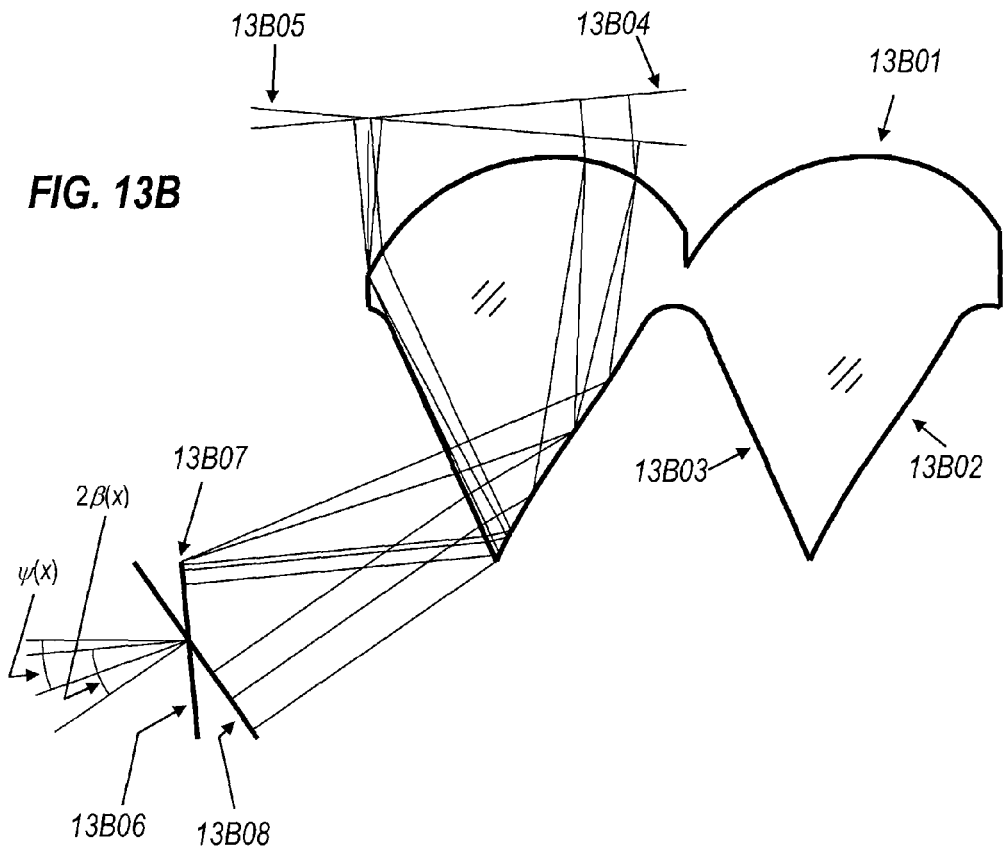
FIG. 13B shows another view of the optic of FIG. 13A with different output wavefronts.

FIG. 13B shows a similar optic to the one in FIG. 13A, but now in the more general case in which angle β is different from angle ψ. This optic is bound by optical surfaces 13B01, 13B02 and 13B03. Edge rays perpendicular to input wavefront 13B04 are either concentrated to point 13B07 (at the lower tip of the optic to the left—not shown) or exit the optic in a direction perpendicular to wavefront 13B06. Edge rays perpendicular to wavefront 13B05 exit the optic in a direction perpendicular to wavefront 13B08.

Figure 13C:
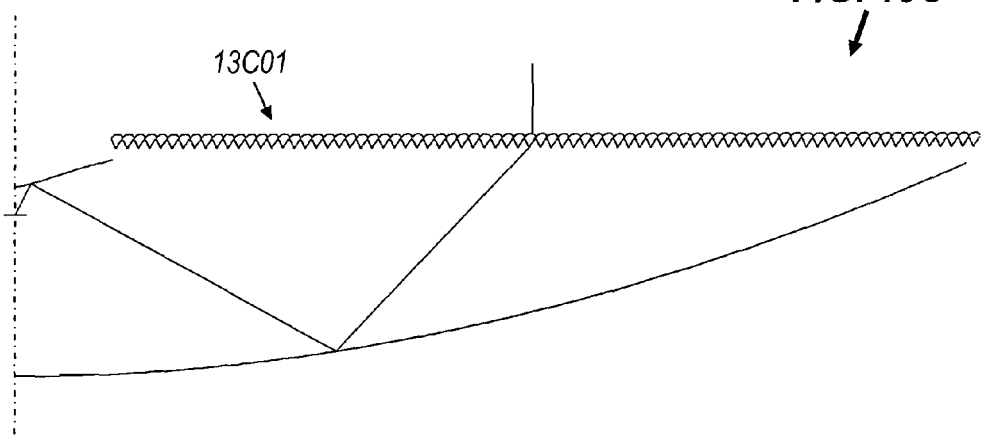
FIG. 13C shows a complete upper optic combined with a lower optic.

FIG. 13C shows an optic similar to the one in FIG. 12 in which the upper optic 1201 is now made of optical elements similar to the ones in FIG. 13A or FIG. 13B, resulting in upper optic 13C01. In general, the shape and use of the optical surfaces of these optical elements will vary along the upper optic 13C01. Similar optical elements may be used in the devices of FIGS. 14 to 21.

Figure 14:
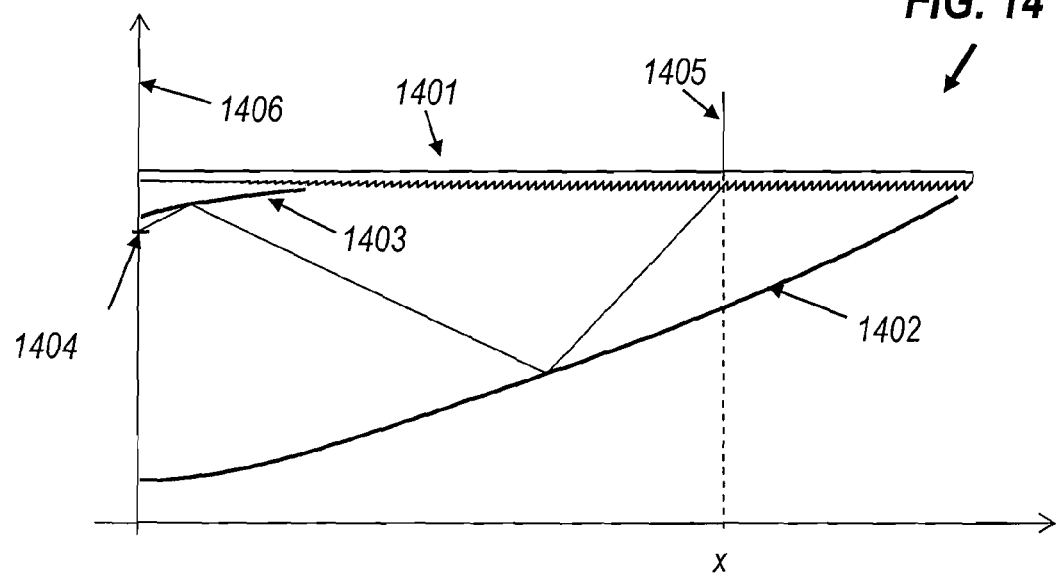

FIG. 14 shows a special case of an embodiment in the general shape of FIG. 12. Its upper optic 1401 is designed as a Fresnel lens while the lower optic is composed of two mirrors, 1402 and 1403. The optic has a receiver 1404. Exemplary vertical ray 1405 at radius x is deflected towards the first mirror 1402 where it is reflected towards the second mirror 1403 and then again reflected toward the receiver 1404. The upper optic may also be designed as a Fresnel lens closer to the optical axis 1406 and as a TIR lens further away, just like in the case of a regular TIR lens. The conditions of design are the same as in FIG. 12.

Figure 15:
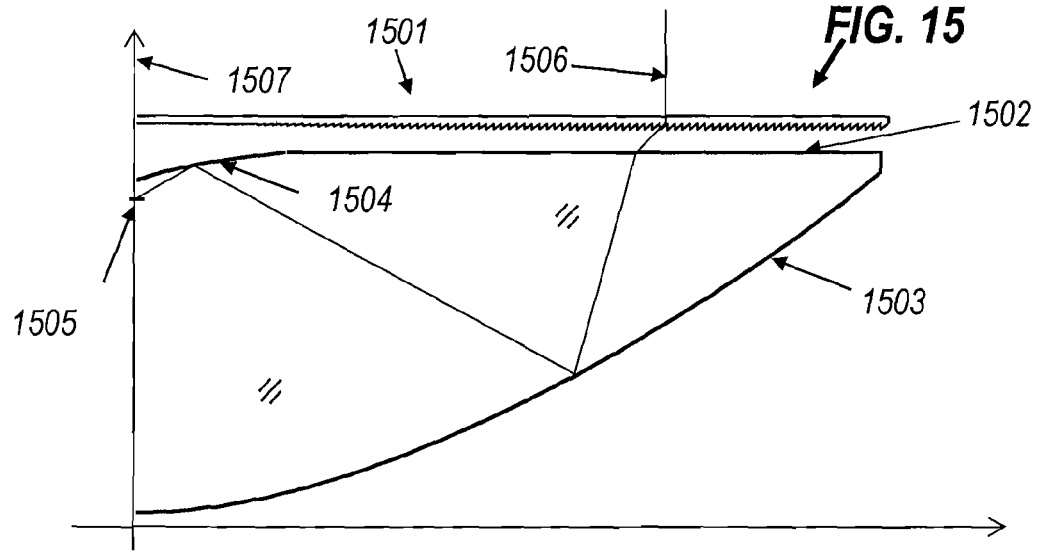

FIG. 15 shows another case of an embodiment similar to that in FIG. 12. In this example the upper optics 1501 is designed as a Fresnel lens, while the lower optics is a dielectric solid piece with refractive index n>1, with three optically active surfaces, 1502, 1503 and 1504. The embodiment has a receiver 1505. The incoming vertical ray 1506 is deflected by the Fresnel lens 1501 towards the solid entry aperture 1502, where it is refracted towards the surface 1503 where is reflected towards surface 1504. The surface 1504 reflects the ray towards the receiver 1505. The surfaces 1503 and 1504 can work by total internal reflection, or can be metalized in areas where the condition of TIR is not accomplished. As in the case of FIG. 14 the upper optic can be designed also as a Fresnel lens closer to the optical axis and as a TIR lens further away.

FIG. 16 shows a similar concept to that in FIG. 15. This example is composed of a single dielectric piece that has three optically active surfaces 1601, 1602 and 1603, and a receiver 1604. The first optical surface, 1601, has integrated teeth (that can be either Fresnel or TIR) and it deflects the incoming vertical ray to the first reflective surface 1602 that reflects the ray towards the second reflective surface 1603, which reflects the ray to the receiver 1604. The reflective surfaces can work by total internal reflection, or be metalized in areas where the condition of TIR is not accomplished.

FIG. 17 shows another special case of an embodiment similar to FIG. 12. The first optic of this embodiment consists of a curved TIR lens 1701, while the lower optics is composed of two mirrors 1702 and 1703. In this example the condition of flatness of the upper optic is removed, which gives another degree of freedom in the design and allows a better control of the teeth size. The top surface of 1701 is shown as curved (to minimize the thickness of this optical component), but it may also be flat. The teeth are on the underside of the lens 1701, so that the upper surface is smooth, even if not flat, and is easier to keep clean. The teeth are protected from damage because they are inside the device.

Figure 18:
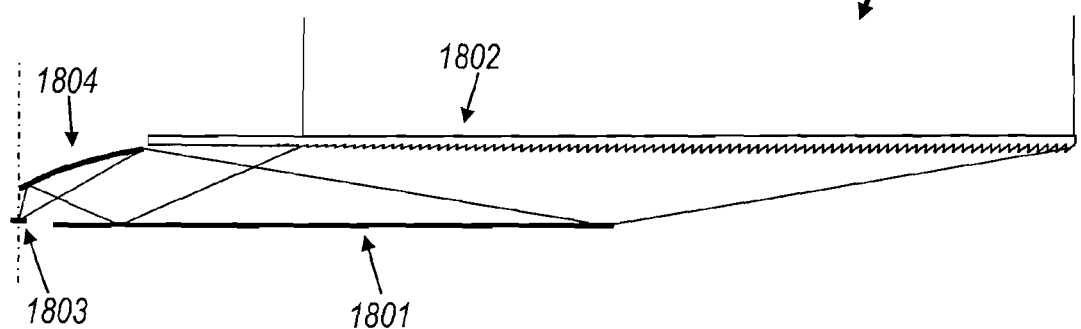

FIG. 18 shows a particular case of the embodiment shown in FIG. 12. First mirror 1202 of the lower optic is now chosen to be flat, resulting in flat mirror 1801. For a given acceptance angle and concentration, this condition defines function $\psi(x)$. Upper optic 1802 is either a Fresnel lens or a combination of Fresnel (closer to the receiver 1803) and a TIR lens (further away from the receiver).

Light is deflected at upper optic 1802, bounces off mirror 1801 and then off mirror 1804 on its way towards receiver 1803.

Figure 19:
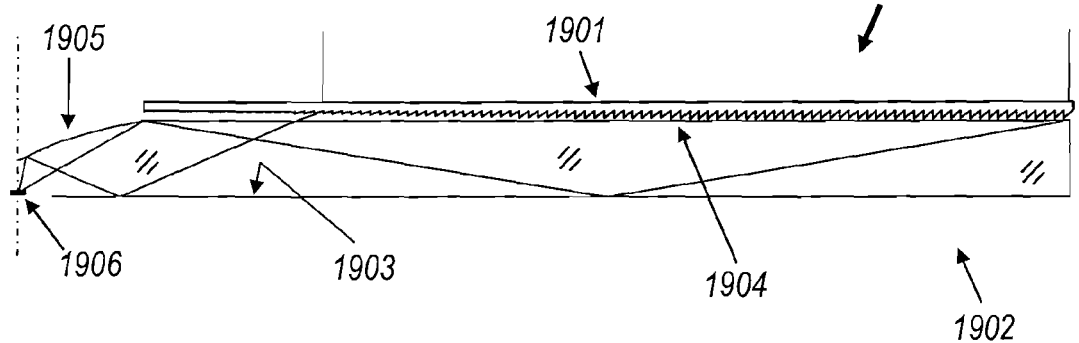

FIG. 19 shows a variation on the embodiment in FIG. 18. The device is made of two parts: upper optic 1901 and dielectric lower optic 1902, bounded by flat surfaces 1903 and 1904 (which may be parallel) and mirror 1905. Mirror 1905 may have to be metalized in the area closer to the receiver 1906.

Figure 20:
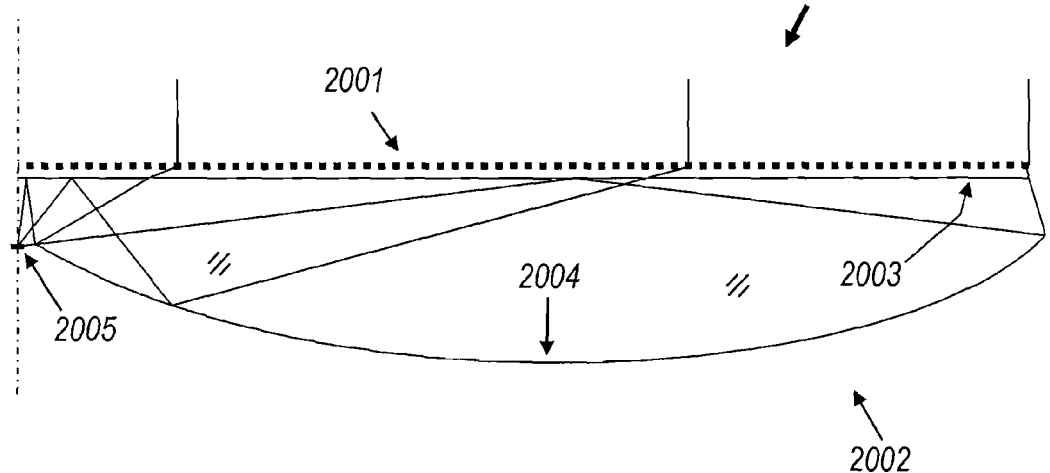

FIG. 20 shows a particular case of the embodiment in FIG. 12. This device is composed of upper optic 2001 (shown diagrammatically) and dielectric lower optic 2002.

Second mirror 1203 of the lower optic in FIG. 12 is now chosen as flat, resulting in flat surface 2003. For a given acceptance angle and concentration, this condition defines function $\psi(x)$. Different areas of optic 2001 may be designed either a Fresnel lens or a combination of Fresnel and a TIR lens.

Incoming light is first deflected by upper optic. The light then refracts at flat surface 2003 into the lower optic 2002. The light then bounces off bottom surface 2004 (by TIR), then again off flat surface 2003 (again by TIR) to the receiver 2005. Surfaces 2003 and/or 2004 may have to be mirrored in the area closer to the receiver 2005.

Figure 21:
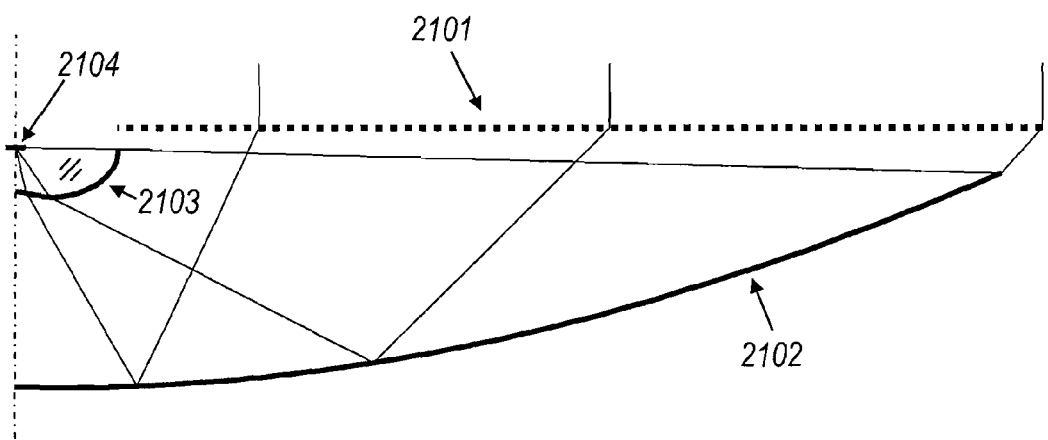

FIG. 21 shows an optic similar to the one in FIG. 12, but in which the second mirror of the lower optic 1203 is replaced by a refractive surface 2103. The resulting optic is now composed of an upper optic 2101 and a lower optic composed of a mirror 2102 and a refractive surface 2103. In FIG. 21, the space between upper optic 2101, mirror 2102, and refractive surface 2103 is air, and the receiver 2104 is in optical contact with a dielectric material bounded by surface 2103.

Figures 22, 23:
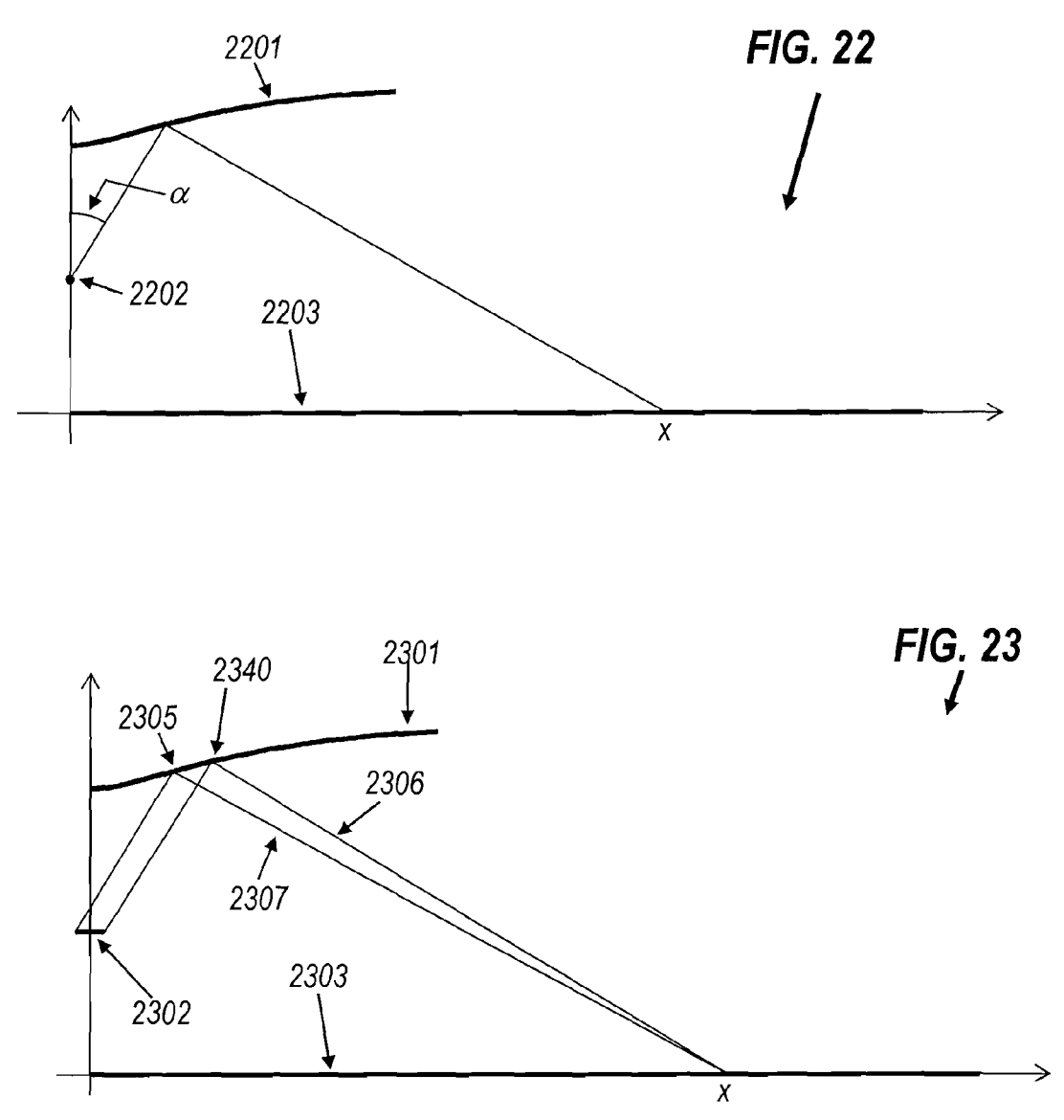

FIG. 22 shows a mirror 2201 that collects the light from a point source 2202 and distributes it on a line 2203. Its shape is such that each ray fulfills $x(\alpha)=m \sin(\alpha)$ where m is a constant, x is the horizontal coordinate at which the ray hits line 2203 and $\alpha$ is the angle with which the ray leaves the receiver. In general, this mirror can be calculated to obey a different law $x(\alpha)$.

FIG. 23 shows a similar situation to that in FIG. 22, but now for an extended light source 2302. Mirror 2301 collects light from extended source 2302 and distributes it on a line 2303. The shape of mirror 2301 is such that it generates on 2303 a prescribed etendue distribution U(x) and the shape may be calculated by the same method used to calculate luminaires for extended sources. The description of that method in Ref. [3] is incorporated herein by reference. If the path of the trailing edge ray 2307, reflected at known point 2305, is known, function U(x) determines the leading edge ray 2306 and a new point 2304 at which ray 2306 is reflected on mirror 2301. Particularly interesting is a uniform etendue distribution U(x)=Constant. Line 2303 is shown in FIG. 23 as a straight line, but in the more general case, line 2303 may be curved.

Figure 24:
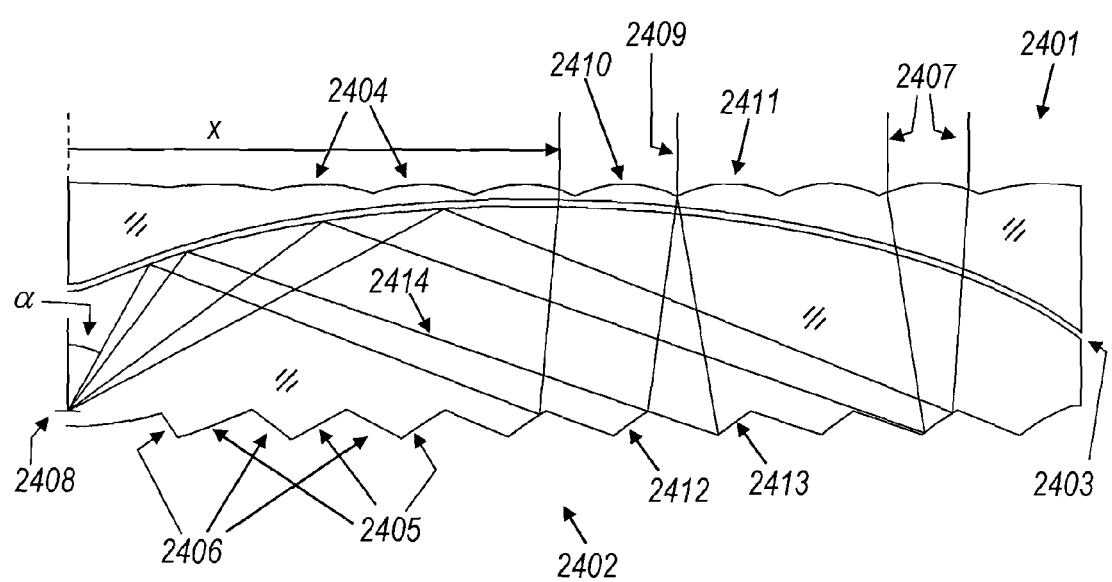
FIG. 24 shows a concentrator utilizing those reflecting elements.

FIG. 24 shows an optic composed of an upper optic 2401 and a lower optic 2402, separated by a low refractive index layer 2403. The low refractive index layer is calculated according to the method described in FIG. 22 and FIG. 23.

The upper optic 2401 has a microstructure on top, composed of many convex surfaces 2404. The lower optic has another microstructure at its bottom composed of surfaces 2405 and 2406. This last microstructure follows line 2203 of FIG. 22 or 2303 of FIG. 23.

Incoming rays 2407 are deflected at one of the top surfaces 2404 towards one of the bottom surfaces 2405. From there these rays are deflected towards the low refractive index layer, which reflects them (by TIR) towards the receiver 2408. The bottom surface of the low refractive index layer 2403 may have to be mirrored on the area closer to the receiver if TIR fails. Vertical light 2409 that hits the intersection between two surfaces 2410 and 2411 may either be refracted by 2410 towards 2412 or by 2411 towards 2413. However, after reflection of 2412 or 2413, this light is again reassembled as 2414 in its way towards the receiver.

Each pair of surfaces 2405 and corresponding surface 2405 may be designed as aplanats (in the case of an infinitesimal receiver size) and a vertical ray entering the optic at a distance x from the optical axis arrives at the receiver making an angle $\alpha$, also to the optical axis. These quantities are related by $x=m \sin(\alpha)$ where m is a constant. When the receiver is of a finite size, the SMS design method may be used to simultaneously design a surface 2404 and its corresponding 2405. Lines 2406 are flow-lines of the source or receiver 2408 when reflected off the low refractive index layer 2403. These guide the light after reflection off surfaces 2405 on its way towards the receiver if the device is used as a concentrator, or away from the source 2408 towards the surfaces 2405 if the device is used as a collimator.

Macroscopically (including many surfaces 2404 on top and the corresponding 2405 at the bottom), the etendue distribution across the top surface of the upper optic 2401 is the same as the etendue distribution across the bottom surface of the bottom optic 2402.

Figure 24A:
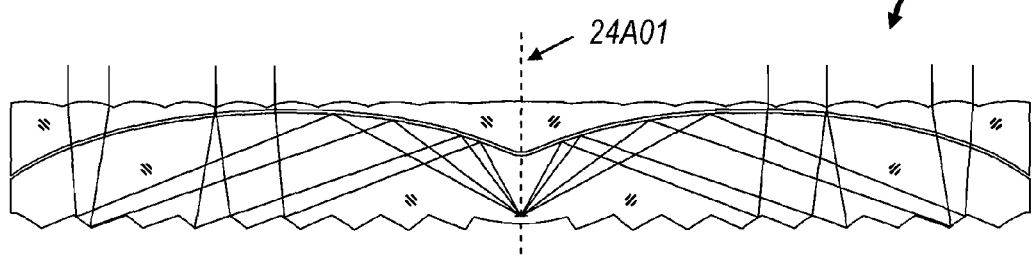
FIG. 24A shows an axial section through a concentrator with circular symmetry.

FIG. 24A shows a vertical section through a concentrator similar to the one in FIG. 24 when given circular symmetry. The axis 24A01 in FIG. 24A corresponds to the vertical axis through source or receiver 2408 at the left edge of FIG. 24.

Figure 25:
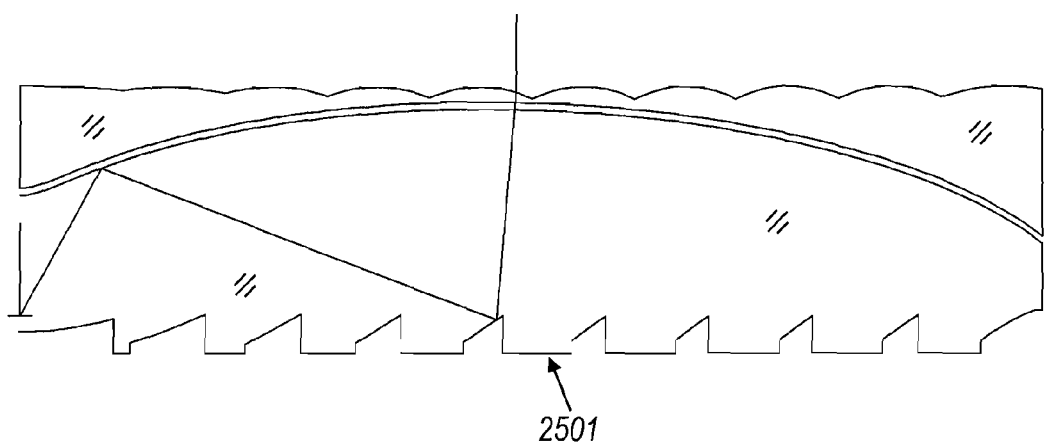
FIG. 25 shows a similar optic for imaging applications.

FIG. 25 shows an embodiment similar to that in FIG. 24 in which surfaces 2406 along the flow lines are replaced by arbitrary shaped surfaces 2501 that do not intersect the light as it travels inside the device. This is usually a better arrangement if these optics are used for imaging applications, because reflections off the flow-lines would redirect light rays from one edge of the image to the other, destroying image formation for the rays reflected off the flow lines.

Figure 26:
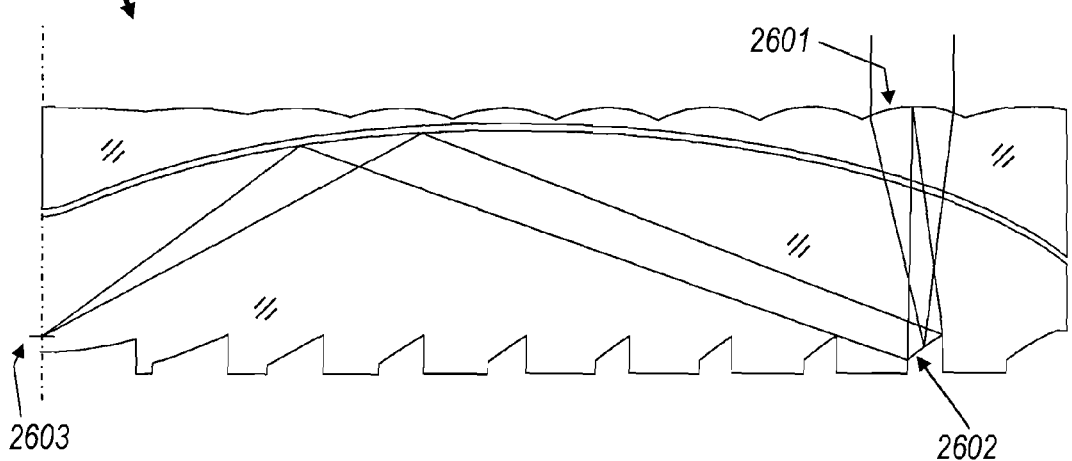
FIG. 26 shows a similar optic, but with integrator elements.

FIG. 26 shows a device similar to the one in FIG. 25, but now designed as an integrator. Each one of the optical surfaces 2601 on the upper optic images the light source onto the corresponding surface 2602 on the lower optic. Surface 2602, in its turn, images surface 2601 onto the receiver 2603 (after reflection in the low index layer corresponding to layer 2403).

Figure 27:
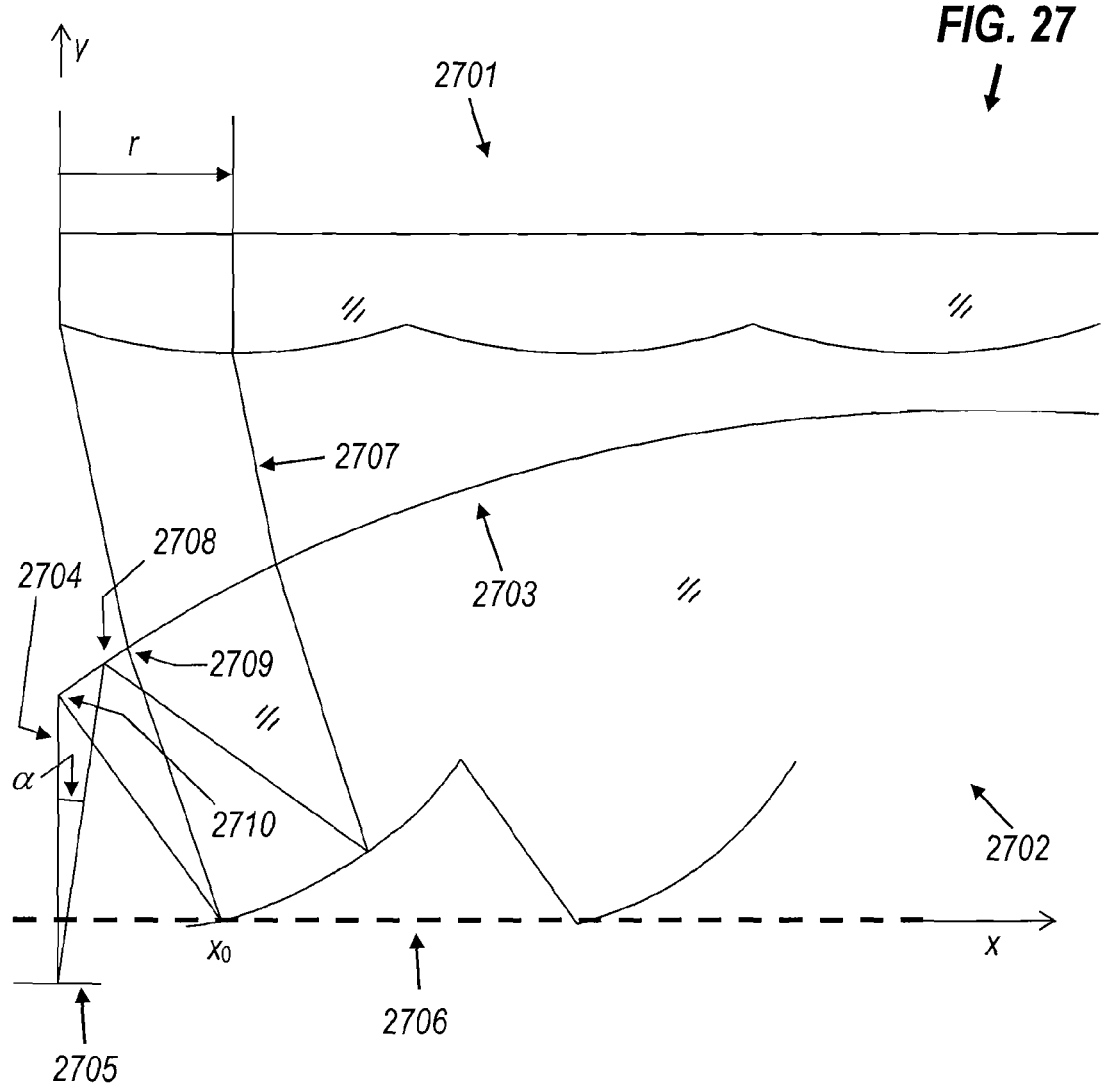
FIG. 27 shows a compact optic with different ray trajectories.

FIG. 27 shows an optical device composed of upper optic 2701 and lower optic 2702. Surface 2703 on the lower optic is similar to the one in FIG. 22, but designed for a given function $x(\alpha)$ in which $x(0)=x_0$ with $x_0>0$, that is, a ray 2704 emitted vertically ($\alpha=0$) from the receiver 2705 and reflected off surface 2703 hits horizontal line 2706 at a coordinate $x_0$. Any given ray 2707, however, satisfies the condition of aplanatism, that is, it complies with $r=m \sin(\alpha)$ where m is a constant and r is the distance from the optical axis to the point the light ray enters the optic.

The advantage of this configuration is that light rays hitting surface 2703 at points closer to the optical axis (such as point 2708) do so at wider angles, opening the possibility of the whole device working by TIR. However, if necessary, the region from point 2709 to 2710 can be mirrored since the incoming light does not cross it.

This design method can also be used in the geometries presented from FIG. 12 through FIG. 26.

Figure 28A:
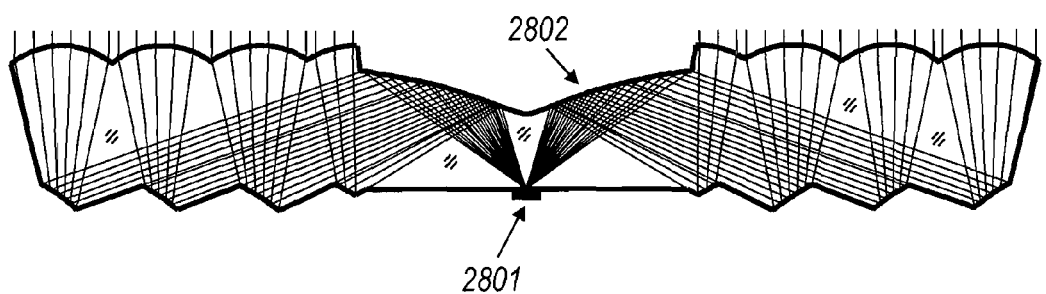
FIG. 28A shows a single piece compact optic.

FIG. 28A shows an optic with receiver 2801. The optic is composed of a single piece. There may (or may not) be an air gap between the receiver and the optic. Top surface 2802 may have to partially mirrored if there is no TIR at the central area. To the extent that top surface 2802 works by TIR, the inner part of the bottom face of the optic (shown as flat in FIG. 28A) may be made into a concave mirror to collect light entering through the TIR surface 2802.

In general, this configuration can be used as a collimator, a concentrator or an imaging device. If used as a collimator, 2801 would be a light source (such as an LED).

Figure 28B:
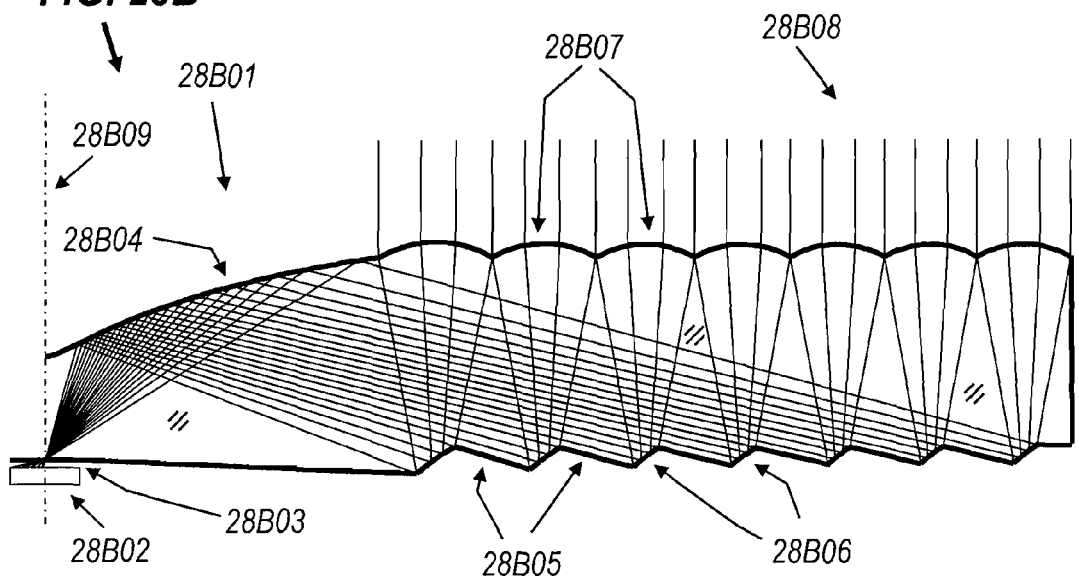
FIG. 28B shows to a larger scale part of an optic similar to that of FIG. 28A.

FIG. 28B shows one side of an optic similar to that in FIG. 28A, but in greater detail. If used as a collimator, it has a source 28B02 separated from the optic 28B01 by an air gap 28B03. Therefore, as the light from this source enters the optic, it will be confined to the critical angle. This light is reflected at top surface 28B04. The central part of surface 28B04 may have to be mirrored, but the outer region will work by TIR. Light then proceeds towards the bottom structure of optic 28B01 where it encounters walls 28B05 that guide it along the flow lines. Eventually light reaches steps 28B06 that reflect it towards the top lenses 28B07. The light finally exits from lenses 28B07 as a collimated beam 28B08. The whole optic has circular symmetry around axis 28B09. Depending on the geometry, steps 28B06 may or may not have to be mirrored.

The optic is made of a single dielectric part and it may be produced by the methods used to produce Compact Disks (CDs) or Digital Video Disks (DVDs).

Figure 29:
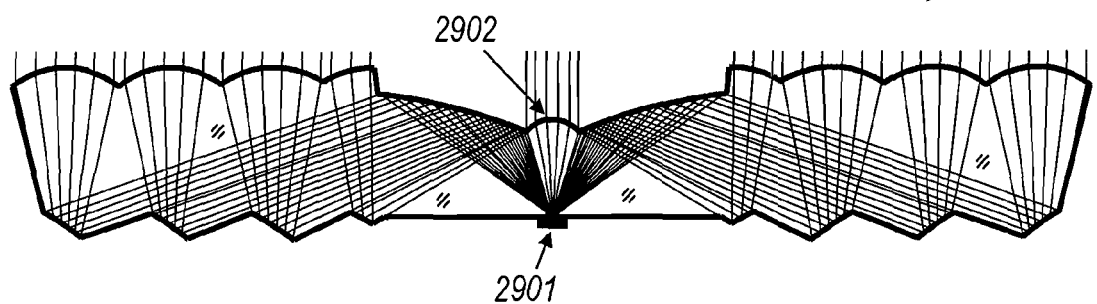
FIG. 29 shows a single piece compact optic with a central converging lens.

FIG. 29 shows a similar device to that in FIG. 28. Also in this case the optic is a single piece, with receiver 2901 separated from the optic by an air gap. Additional central lens 2902 concentrates some light onto the receiver. Lens 2902 may also be used in some other embodiments.

Figure 30:
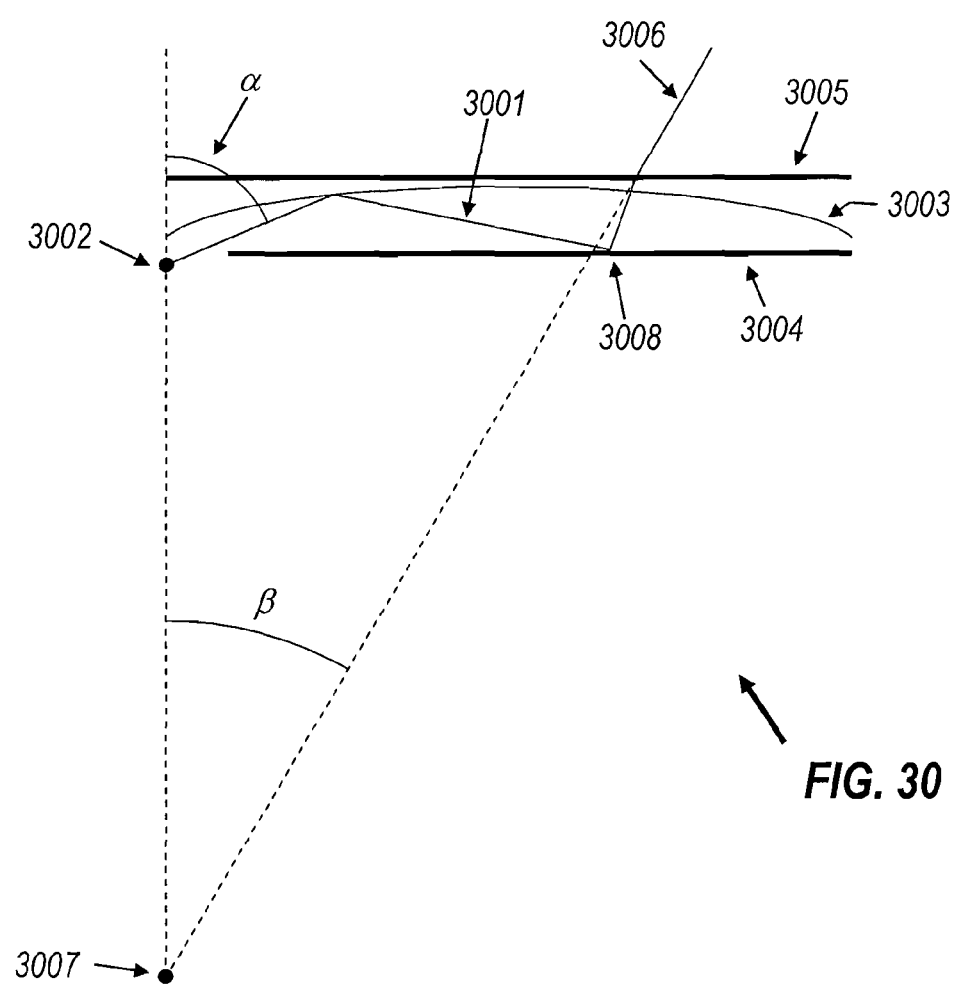
FIG. 30 is a diagram illustrating a further method of designing an optic.

FIG. 30 shows a construction method similar to that in FIG. 22, but now for the case in which the emitted light appears to come from a virtual point source. A light ray 3001 emitted from a point source 3002 at an angle α to the vertical (optical axis) is reflected by TIR at a low-index surface 3003 towards microstructured bottom surface 3004, which the ray meets at point 3008. From here this ray is reflected upwards, passing through low-index layer 3003 towards top surface 3005, where the ray is refracted, exiting in a direction 3006 making an angle β to the vertical, as if coming from a virtual source 3007.

The shape of low-index reflective surface 3003 can be calculated if, for example, we assume surface 3005 to be flat and that angles α and β are related, for example, by sin β=m sin α where m is a constant. For a given ray emitted from 3002 at an angle α to the vertical, we can calculate angle β and the path of ray 3006 since its extension must intersect virtual point source 3007. Ray 3006 may then be refracted at surface 3005 and continued to intersect with surface 3004, giving us point 3008. Using this method, for each ray emitted from 3002 we can determine to what point 3008 on 3004 it must be reflected and therefore the shape of mirror 3003 can be determined. This is similar to what happens in FIG. 22.

FIG. 31A shows an example of a design based on the overall geometry in FIG. 30. Optic 3101 creates a virtual image 3102 of the source 3103. The optic is composed of two parts 3104 and 3105 separated by a low refractive index layer 3106.

In this figure, insert 3107 shows a detail of the optic 3101. A light ray 3108 emitted from the source 3103 is reflected by TIR at surface 3106. From there it is redirected towards bottom microstructure. Reflective surface 3109 of the bottom microstructure and corresponding refractive surface 3110 of the top surface are calculated simultaneously so that incoming ray 3108 exits the optic as if coming from virtual source 3102. The relationship between emission angle α at the actual source and exit angle β (see FIG. 30) is given by sin β=m sin α as stated above. Surfaces 3111 follow the flow lines of the light emitted by the source and reflected at surface 3106.

Figure 31B:
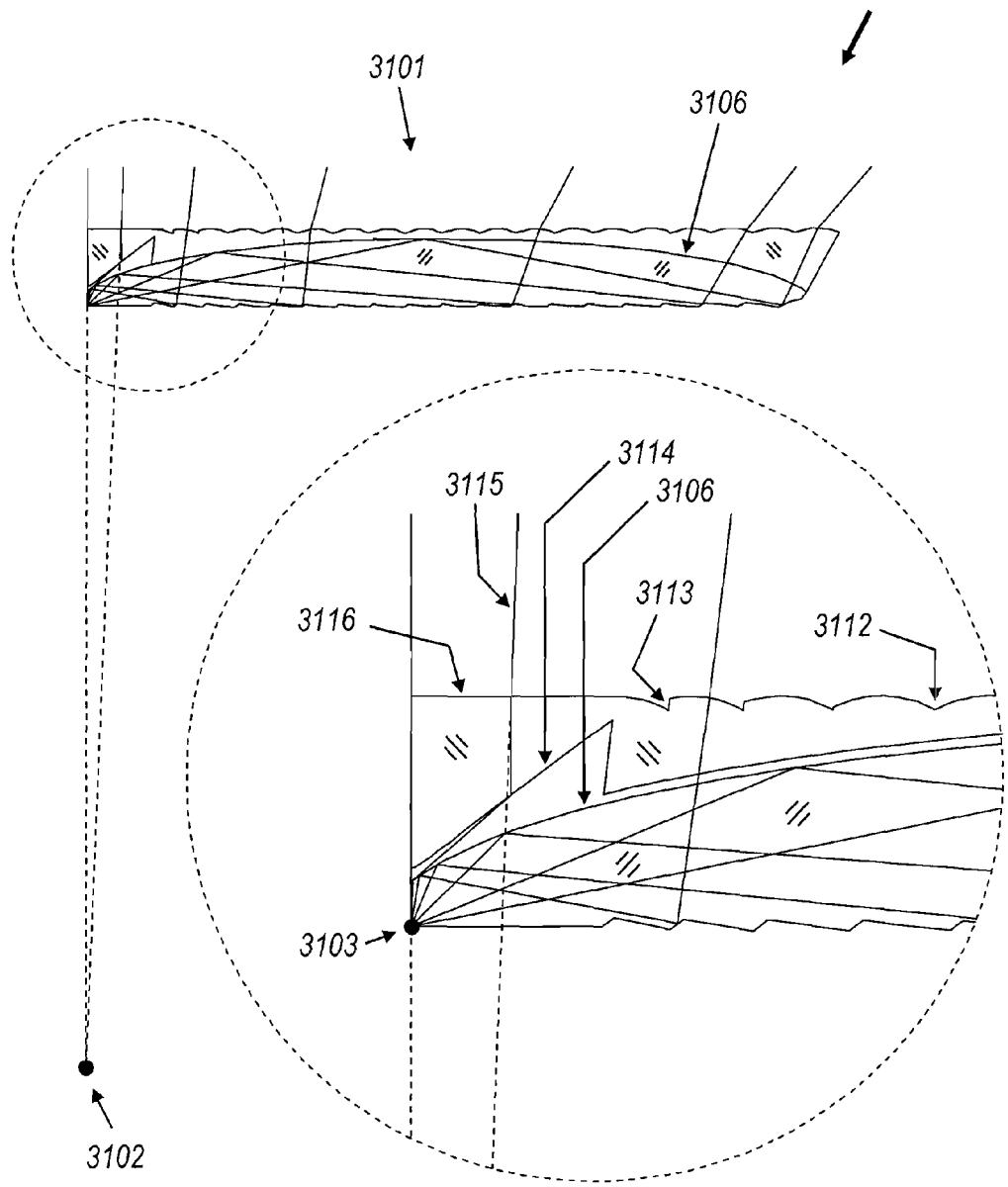
FIG. 31B shows a further axial cross section through the optic of FIG. 31A.

FIG. 31B shows another detail of the same optic 3101 shown in FIG. 31A. Again, the light emitted from source 3103 exits the optic as if coming from virtual source 3102. The optical surfaces of the top microstructure may form a continuous surface, as is the case at point 3112, or there may be discontinuities, as is the case at point 3113.

The central portion of surface 3106 (directly above source 3103) that cannot achieve TIR, and the associated portion 3114 of the undersurface of the top part of the optic may be calculated simultaneously so that a ray emitted from source 3103 is refracted at surface 3106, then at surface 3114, then at (flat) top surface 3116, exiting the device as if coming from virtual source 3102.

Various changes are possible without departing from the scope of the invention as defined in the claims.

Although specific embodiments have been described, the skilled reader will understand how features of different embodiments may be combined. Even where not explicitly stated, the skilled reader will understand how the two-dimensional sections shown in the drawings may be translated perpendicular to the plane of the paper to form an elongated "trough" configuration, rotated to form a circularly symmetric configuration, or otherwise expanded into a three-dimensional device.

Various terms of orientation have been used, for ease of reference to the drawings, which are mostly oriented with the collimated beam aimed directly upwards away from the collimator or downwards towards the concentrator. However, those orientations are not limiting, and the various optical devices disclosed may be used in any expedient orientation. For example, a concentrator used in a solar photovoltaic collector will usually be used with the collimated beam aligned on the sun. A collimator used in an automobile headlight will usually be used with the collimated beam aligned approximately horizontally, and the exact alignment chosen to comply with relevant laws and regulations.

When analyzing a constructed optical device, the wavefronts used to construct the device can be determined, either notionally or physically, by placing a light source at the source (or receiver) position, placing a pinhole in the exit (or entrance) aperture, and determining the edge rays of the cone of light that emerges through the pinhole. By repeating this process for different pinhole positions, the phase space representation of the wavefronts outside the exit aperture can be reconstructed.

The preceding description of the presently contemplated best mode of practicing the invention is not to be taken in a limiting sense, but is made merely for the purpose of describing the general principles of the invention. The full scope of the invention should be determined with reference to the Claims.

REFERENCES

1. Julio Chaves, Manuel Collares-Pereira, *Ultra flat ideal concentrators of high concentration*, Solar Energy, 69, p. 269, 2000
2. Julio Chaves, Manuel Collares-Pereira, *Ideal concentrators with gaps*, Appl. Opt., 41, p. 1267, 2002
3. Julio Chaves, *Introduction to Nonimaging Optics*, CRC Press, 2008
4. Juan Carlos Miñano, Pablo Benitez, Julio Chaves, Waqidi Falicoff, William A. Parkyn, Jr., *Étendue-conserving illumination-optics for backlights and frontlights*, US patent application no. 2009-0167651
5. Juan C. Miñano, Pablo Benitez, Julio Chaves, Maikel Hernandez, Oliver Dross, and Asuncion Santamaria, *High-efficiency LED backlight optics designed with the flow-line method*, Nonimaging Optics and Efficient illumination Systems II, Proc. SPIE, Vol. 5942, 2005
6. Julio C. Chaves, Waqidi Falicoff, Juan C. Miñano, Pablo Benitez, William A. Parkyn Jr., Roberto Alvarez, Oliver Dross, *Optical manifold for light-emitting diodes*, U.S. Pat. No. 7,380,962
7. Julio Chaves, Waqidi Falicoff, Oliver Dross, Juan Carlos Miñano, Pablo Benitez, William A. Parkyn, *Combination of light sources and light distribution using manifold optics*, Nonimaging Optics and Efficient Illumination Systems III, SPIE Vol. 6338, 2006
8. Aleksandra Cvetkovic, Oliver Dross, Julio Chaves, Pablo Benitez, Juan C. Miñano, and Rubén Mohedano, *Étendue-preserving mixing and projection optics for high-luminance LEDs, applied to automotive headlamps*, Optics Express, Vol. 14, Issue 26, pp. 13014-13020, 2006
9. Oliver Dross, J. C. Miñano, Pablo Benitez, A. Cvetkovic, Julio Chaves, *Non-imaging optics combine LEDs into one bright source*, in SPIE Newsroom, http://newsroom.spie.org/x3596.xml, 2006
10. Oliver Dross, Aleksandra Cvetkovic, Julio Chaves, Pablo Benitez, Juan C. Miñano, *LED Headlight Architecture that creates a High Quality Beam Pattern independent of LED Shortcomings*, Nonimaging Optics and Efficient Illumination Systems II, SPIE Vol. 5942, p. 126-135, 2005

11. Lawrence Mertz, *Aspheric potpourri*, Applied Optics, Vol. 20, No. 7, pp. 1127-1131, 1981

We claim:

1. An optical system comprising, in order:
a first optical surface at which light is deflected only a predetermined number of times;
a faceted second optical surface; and
a faceted third optical surface;
wherein the optical system is operative to convert a first bundle of rays that is continuous in phase space outside the first optical surface into a second bundle of rays that is continuous in phase space outside the third optical surface;
wherein between the second and third optical surfaces the rays making up the first and second bundles form discrete sub-bundles each passing from an element of the second optical surface to an element of the third optical surface, and the sub-bundles do not form a continuous bundle in phase space;
wherein the phase space has dimensions representing the position and angle at which rays cross a surface transverse to the bundle of rays.

2. The optical system of claim 1, further comprising at least one of a light source providing the first bundle of rays directed towards the first optical surface and a light receiver receiving the second bundle of rays directed away from the third optical surface.

3. The optical system of claim 1, further comprising at least one of a light source providing the second bundle of rays directed towards the third optical surface and a light receiver receiving the first bundle of rays directed away from the first optical surface.

4. The optical system of claim 1, wherein there exist a defined first bundle consisting essentially of all rays entering or leaving the first optical surface within a first given range of angles of a first given direction, and a defined second bundle consisting essentially of all rays leaving or entering the third optical surface within a second given range of angles of a second given direction, such that the optical system converts substantially all rays of said defined first bundle to rays of said defined second bundle, and vice versa.

5. The optical system of claim 4, wherein said first given range of angles forms a first cone with its axis in said first given direction, and said second given range of angles forms a second cone with its axis in said second given direction.

6. The optical system of claim 1, further comprising a light receiver receiving the first bundle of rays directed away from the first optical surface, and wherein, when said second bundle is a conventional representation of sunlight shining on the third optical surface, the optical system is operative to convert substantially all rays of said second bundle into rays of said first bundle incident on said light receiver.

7. The optical system of claim 1, which is rotationally symmetric, and wherein the optical system is operative to convert substantially all rays of the first bundle of rays in a radial plane into rays of the second bundle of rays in a radial plane, and to convert substantially all rays of the second bundle of rays in a radial plane into rays of the first bundle of rays in a radial plane.

8. The optical system of claim 1, which is of uniform shape in a longitudinal direction, and wherein the optical system is operative to convert substantially all rays of the first bundle of rays into rays of the second bundle of rays, and to convert substantially all rays of the second bundle of rays into rays of the first bundle of rays, except for rays reaching a longitudinal end of the system.

9. The optical system of claim 1, wherein the first optical surface deflects the first bundle of rays only once.

10. The optical system of claim 1, wherein the first optical surface comprises a pair of optical surfaces by which the first bundle of rays is successively directed.

11. The optical system of claim 10, wherein the first optical surface deflects the first bundle of rays only twice, one deflection being at each of said pair of optical surfaces.

12. The optical system of claim 1, wherein the second optical surface comprises a plurality of facets separated by portions of the first optical surface.

13. An optical system comprising, in order:
a first optical surface;
a faceted second optical surface; and
a faceted third optical surface;
wherein the optical system is operative to convert a first bundle of rays that is continuous in phase space outside the first optical surface into a second bundle of rays that is continuous in phase space outside the third optical surface;
wherein between the second and third optical surfaces the rays making up the first and second bundles form discrete sub-bundles each passing from an element of the second optical surface to an element of the third optical surface, and the sub-bundles do not form a continuous bundle in phase space;
wherein the phase space has dimensions representing the position and angle at which rays cross a surface transverse to the bundle of rays;
wherein the faceted second optical surface is discontinuous, and comprises portions separated by a faceted surface of said first optical surface, wherein said faceted surface of said first optical surface comprises at least two families of facets that are parallel to flowlines of said first bundle of rays and are transverse to each other.

14. An optical system comprising, in order:
a first optical surface;
a faceted second optical surface; and
a faceted third optical surface;
at least one of a light source providing the first bundle of rays directed towards the first optical surface and a light receiver receiving the first bundle of rays directed away from the first optical surface;
wherein the optical system is operative to convert a first bundle of rays that is continuous in phase space outside the first optical surface into a second bundle of rays that is continuous in phase space outside the third optical surface;
wherein between the second and third optical surfaces the rays making up the first and second bundles form discrete sub-bundles each passing from an element of the second optical surface to an element of the third optical surface, and the sub-bundles do not form a continuous bundle in phase space;
wherein the phase space has dimensions representing the position and angle at which rays cross a surface transverse to the bundle of rays;
wherein for rays of the second bundle with zero acceptance angle, the path of the rays fulfills $x = m \sin(\alpha)$, where:
m is a constant;
x is a horizontal coordinate at which the ray enters the optic; and
$\alpha$ is an angle at which the ray meets the light source or light receiver outside the first optical surface.

* * * * *